(12) United States Patent
Kim et al.

(10) Patent No.: US 8,772,951 B1
(45) Date of Patent: Jul. 8, 2014

(54) ULTRA FINE PITCH AND SPACING INTERCONNECTS FOR SUBSTRATE

(71) Applicant: QUALCOMM Incorporated, San Diego, CA (US)

(72) Inventors: Chin-Kwan Kim, San Diego, CA (US); Rajneesh Kumar, San Diego, CA (US); Omar James Bchir, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/014,192

(22) Filed: Aug. 29, 2013

(51) Int. Cl.
*H01L 21/4763* (2006.01)
*H01L 29/40* (2006.01)

(52) U.S. Cl.
USPC ........... 257/774; 438/618; 438/629; 438/637; 257/775

(58) Field of Classification Search
USPC .......... 438/618, 620, 629, 637; 257/734, 748, 257/774, 775
See application file for complete search history.

(56) References Cited

U.S. PATENT DOCUMENTS

| 5,945,741 | A | * | 8/1999 | Ohsawa et al. ............... 257/777 |
| 6,137,178 | A | | 10/2000 | Park |
| 6,570,258 | B2 | | 5/2003 | Ma et al. |
| 6,638,863 | B2 | * | 10/2003 | Wang et al. .................. 438/690 |
| 6,992,394 | B2 | | 1/2006 | Park et al. |
| 7,649,749 | B2 | * | 1/2010 | Tsukano et al. ............. 361/795 |
| 7,911,037 | B1 | | 3/2011 | Huemoeller et al. |
| 7,928,549 | B2 | | 4/2011 | Chen et al. |
| 2004/0264837 | A1 | * | 12/2004 | Ogawa ........................... 385/14 |

* cited by examiner

*Primary Examiner* — Hsien Ming Lee
(74) *Attorney, Agent, or Firm* — Loza & Loza, LLP

(57) ABSTRACT

Some novel features pertain to a substrate that includes a first dielectric layer, a first interconnect embedded in a first surface of the first dielectric layer, and a second interconnect on the first surface of the first dielectric layer. The first interconnect is offset from the first surface of the first dielectric layer. The first interconnect being offset towards an inner portion of the first dielectric layer. In some implementations, the substrate further includes a third interconnect embedded in the first surface of the first dielectric layer, and a fourth interconnect on the first surface of the first dielectric layer. The first interconnect and the second interconnect are adjacent interconnects. In some implementations, the substrate further includes a first pad on the first surface of the first dielectric layer. The first pad is coupled to the first interconnect.

24 Claims, 20 Drawing Sheets

US 8,772,951 B1

ULTRA FINE PITCH AND SPACING INTERCONNECTS FOR SUBSTRATE

BACKGROUND

1. Field

Various features relate to a substrate that includes ultra fine pitch and spacing interconnects.

2. Background

There is an ongoing need to reduce the size of integrated circuit (IC) packages and dies. However, there are many issues and problems associated with reducing the size of such IC packages and dies.

FIG. 1 illustrates an example of a substrate that includes conventional routing and/or interconnects. Specifically, FIG. 1 illustrates an example of a substrate 100 that includes a dielectric layer 102, a first interconnect 104, a second interconnect 106, a third interconnect 108, a fourth interconnect 110, a first pad 112, a first via 114, a second pad 116, a second via 118, a third pad 120, a fourth pad 122, a fifth pad 124, a sixth pad 126, a first solder resist layer 130, and a second solder resist layer 132.

The first interconnect 104, the second interconnect 106, the third interconnect 108 and the fourth interconnect 110 are embedded in the dielectric layer 102. Specifically, the first interconnect 104, the second interconnect 106, the third interconnect 108, and the fourth interconnect are embedded in a first surface (e.g., top surface) of the dielectric layer 102. As shown in FIG. 1, portions (e.g., top portions) of the first interconnect 104, the second interconnect 106, the third interconnect 108, and the fourth interconnect 110 are exposed and not covered by the dielectric layer 102.

The first pad 112 is coupled to the first via 114. The first pad 112 and the first via 114 are embedded in the dielectric layer 102. The second pad 116 is coupled to the second via 118. The second pad 116 and the second via 116 are embedded in the dielectric layer 102. The third pad 120, the fourth pad 122, the fifth pad 124, and the sixth pad 126 are on a second surface (e.g., bottom surface) of the dielectric layer 102. The third pad 120 is coupled to the first via 114. The fourth pad 122 is coupled to the second via 118.

The first solder resist layer 130 covers a portion of the first surface (e.g., top surface) of the dielectric layer 102. As shown in FIG. 1, the first solder resist layer 130 does not cover the first, second, third and fourth interconnects 104-110.

The second solder resist layer 132 covers a portions the third and fourth pads 120-122, but leaves the fifth and sixth pads 124-126 exposed.

The distance between the first, second, third and fourth interconnects 104-110 is limited to a minimum spacing due to concerns of shorting that can occur when a bump (e.g., from a die) is coupled to the interconnects 104-110 of the substrate 100. As such, under conventional routing and/or interconnects, it is not possible to further reduce the size of a substrate by providing several interconnects in a smaller space (e.g., not possible to reduce the size of a substrate by increasing the interconnect density of the substrate).

FIG. 2 illustrates another example of a substrate that includes conventional routing and/or interconnects. Specifically, FIG. 2 illustrates an example of a substrate 200 that includes a dielectric layer 202, a first interconnect 204, a second interconnect 206, a third interconnect 208, a fourth interconnect 210, a first pad 212, a first via 214, a second via 216, a second via 218, a third pad 220, a fourth pad 222, a fifth pad 224, a sixth pad 226, a first solder resist layer 230, and a second solder resist layer 232.

The first interconnect 204, the second interconnect 206, the third interconnect 208 and the fourth interconnect 210 are on a first surface (e.g., top surface) of the dielectric layer 202. As shown in FIG. 2, portions (e.g., top and side portions) of the first interconnect 204, the second interconnect 206, the third interconnect 208, and the fourth interconnect 210 are exposed.

The first pad 212 and the second pad 216 are on the first surface (e.g., top surface) of the dielectric layer 202. The first via 214 and the second via 218 are embedded in the dielectric layer 202. The first pad 212 is coupled to the first via 214. The second pad 216 is coupled to the second via 218. The third pad 220, the fourth pad 222, the fifth pad 224, and the sixth pad 226 are on a second surface (e.g., bottom surface) of the dielectric layer 202. The third pad 220 is coupled to the first via 214. The fourth pad 222 is coupled to the second via 218.

The first solder resist layer 230 covers a portion of the first surface (e.g., top surface) of the dielectric layer 202. As shown in FIG. 2, the first solder resist layer 230 does not cover the first, second, third and fourth interconnects 204-210.

The second solder resist layer 232 covers a portions the third and fourth pads 220-222, but leaves the fifth and sixth pads 224-226 exposed.

As in the example of FIG. 1, the distance between the first, second, third and fourth interconnects 204-210 is limited to a minimum spacing due to concerns of shorting that can occur when a bump (e.g., from a die) is coupled to the interconnects 204-210 of the substrate 200. As such, under conventional routing and/or interconnects, it is not possible to further reduce the size of a substrate by providing several interconnects in a smaller space (e.g., not possible to reduce the size of a substrate by increasing the interconnect density of the substrate).

Therefore, there is need for a novel substrate that provides greater interconnect density, while avoiding shorting problems that can occur when a greater number of interconnects and/or routes are provided in a smaller area of the substrate. Ideally, such a novel substrate not only provides better interconnect spacing and/or pitch, but is easy and cost effective to produce/manufacture as well.

SUMMARY

Various features relate to a substrate that includes ultra fine pitch and spacing interconnects.

A first example provides a substrate that includes a first dielectric layer, a first interconnect embedded in a first surface of the first dielectric layer, and a second interconnect on the first surface of the first dielectric layer. The first interconnect is offset from the first surface of the first dielectric layer. The first interconnect being offset towards an inner portion of the first dielectric layer.

According to an aspect, the substrate further includes a third interconnect embedded in the first surface of the first dielectric layer, and a fourth interconnect on the first surface of the first dielectric layer. In some implementations, a lateral spacing between the first interconnect and the third interconnect is 15 microns (μm) or less.

According to one aspect, a lateral spacing between the first interconnect and the second interconnect is 5 microns (μm) or less, wherein the first interconnect and the second interconnect are adjacent interconnects.

According to one aspect, the substrate further includes a first pad on the first surface of the first dielectric layer. The first pad is coupled to the first interconnect. The substrate also includes a second pad on the first surface of the first dielectric layer. The second pad is coupled to the second interconnect.

According to an aspect, the first surface is a top surface of the first dielectric layer.

According to one aspect, the substrate further includes a second dielectric layer.

According to an aspect, the first and second interconnects are traces.

According to one aspect, the first interconnect is from several embedded interconnects in the first surface of the dielectric layer. The second interconnect is from several surface interconnects on the first surface of the dielectric layer.

According to an aspect, the substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides an apparatus that includes a first dielectric layer, a first interconnect means embedded in a first surface of the first dielectric layer, and a second interconnect means on the first surface of the first dielectric layer. The first interconnect means is offset from the first surface of the first dielectric layer. The first interconnect means being offset towards an inner portion of the first dielectric layer.

According to an aspect, the apparatus further includes a third interconnect means embedded in the first surface of the first dielectric layer, and a fourth interconnect means on the first surface of the first dielectric layer. In some implementations, a lateral spacing between the first interconnect means and the third interconnect means is 15 microns ($\mu$m) or less.

According to one aspect, a lateral spacing between the first interconnect means and the second interconnect means is 5 microns ($\mu$m) or less, wherein the first interconnect means and the second interconnect means are adjacent interconnect means.

According to one aspect, the apparatus further includes a first pad means on the first surface of the first dielectric layer. The first pad means is coupled to the first interconnect means. The apparatus also includes a second pad means on the first surface of the first dielectric layer. The second pad means is coupled to the second interconnect means.

According to an aspect, the first surface is a top surface of the first dielectric layer.

According to one aspect, the apparatus further includes a second dielectric layer.

According to an aspect, the first and second interconnect means are traces.

According to one aspect, the first interconnect means is from several embedded interconnect means in the first surface of the dielectric layer. The second interconnect means is from several surface interconnect means on the first surface of the dielectric layer.

According to an aspect, the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides a method for providing a substrate. The method provides a first dielectric layer. The method also provides a first interconnect embedded in a first surface of the first dielectric layer. The first interconnect is offset from the first surface of the first dielectric layer. The first interconnect being offset towards an inner portion of the first dielectric layer. The method further provides a second interconnect on the first surface of the first dielectric layer.

According to an aspect, the method further provides a third interconnect embedded in the first surface of the first dielectric layer. The method also provides a fourth interconnect on the first surface of the first dielectric layer. In some implementations, a lateral spacing between the first interconnect and the third interconnect is 15 microns ($\mu$m) or less.

According to one aspect, a lateral spacing between the first interconnect and the second interconnect is 5 microns ($\mu$m) or less, wherein the first interconnect and the second interconnect are adjacent interconnects.

According to one aspect, the method further provides a first pad on the first surface of the first dielectric layer. The first pad is coupled to the first interconnect. The method also provides a second pad on the first surface of the first dielectric layer. The second pad is coupled to the second interconnect.

According to an aspect, the first surface is a top surface of the first dielectric layer.

According to one aspect, the method further provides a second dielectric layer.

According to an aspect, the first and second interconnects are traces.

According to one aspect, the first interconnect is from several embedded interconnects in the first surface of the dielectric layer. The second interconnect is from several surface interconnects on the first surface of the dielectric layer.

According to an aspect, the substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some novel features pertain to a substrate that includes a first dielectric layer, a first interconnect embedded in a first surface of the first dielectric layer, and a second interconnect on the first surface of the first dielectric layer. In some implementations, the first interconnect is offset from the first surface of the first dielectric layer. The first interconnect is offset towards an inner portion of the first dielectric layer. In some implementations, the first interconnect is offset from the first surface of the first dielectric layer such that a cavity in the dielectric layer is between the offset first interconnect and the surface of the dielectric. In some implementations, the substrate further includes a third interconnect embedded in the first surface of the first dielectric layer, and a fourth interconnect on the first surface of the first dielectric layer. In some implementations, a lateral spacing between the first interconnect and the third interconnect is 30 microns ($\mu m$) or less. In some implementations, a lateral spacing between the first interconnect and the second interconnect is 10 microns ($\mu m$) or less. In some implementations, a lateral spacing between the first interconnect and the third interconnect is 15 microns ($\mu m$) or less. In some implementations, a lateral spacing between the first interconnect and the second interconnect is 5 microns ($\mu m$) or less. The first interconnect and the second interconnect are adjacent interconnects. In some implementations, the substrate further includes a first pad on the first surface of the first dielectric layer. The first pad is coupled to the first interconnect. In some implementations, the substrate also includes a second pad on the first surface of the first dielectric layer. The second pad is coupled to the second interconnect. In some implementations, the substrate further includes a second dielectric layer. In some implementations, the first and second interconnects are traces. In some implementations, the first interconnect is from several embedded interconnects in the first surface of the dielectric layer. In some implementations, the second interconnect is from several surface interconnects on the first surface of the dielectric layer.

Exemplary Substrate Comprising Embedded Interconnects and Surface Interconnects

Figure 1:
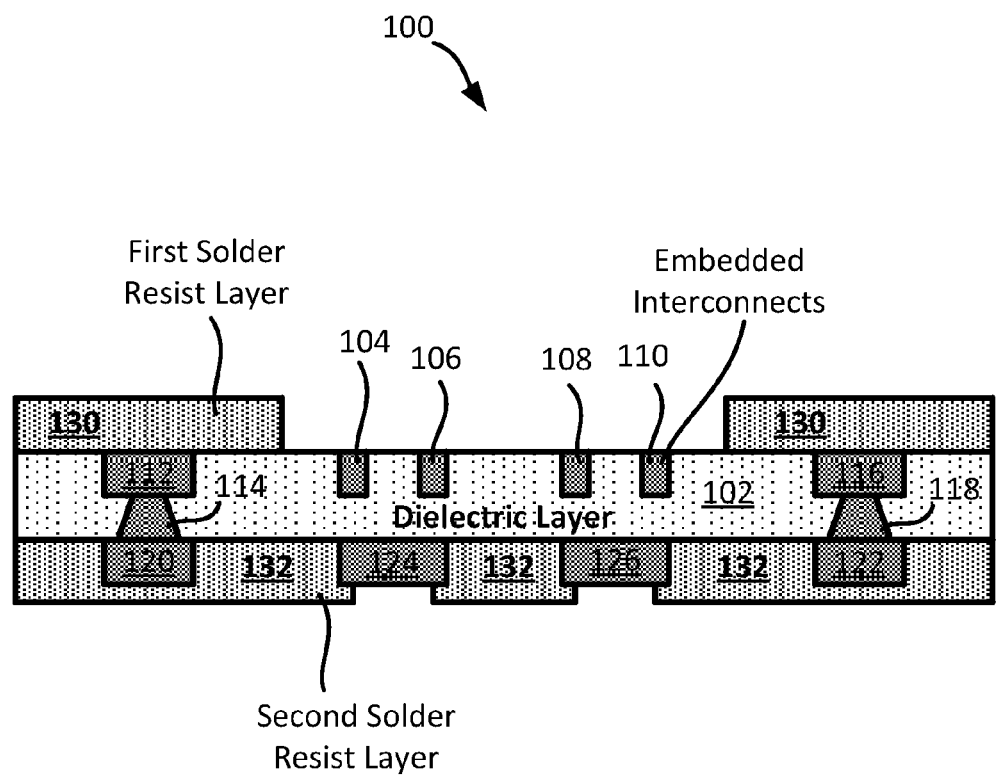
FIG. 1 illustrates a conventional substrate.
Figure 2:
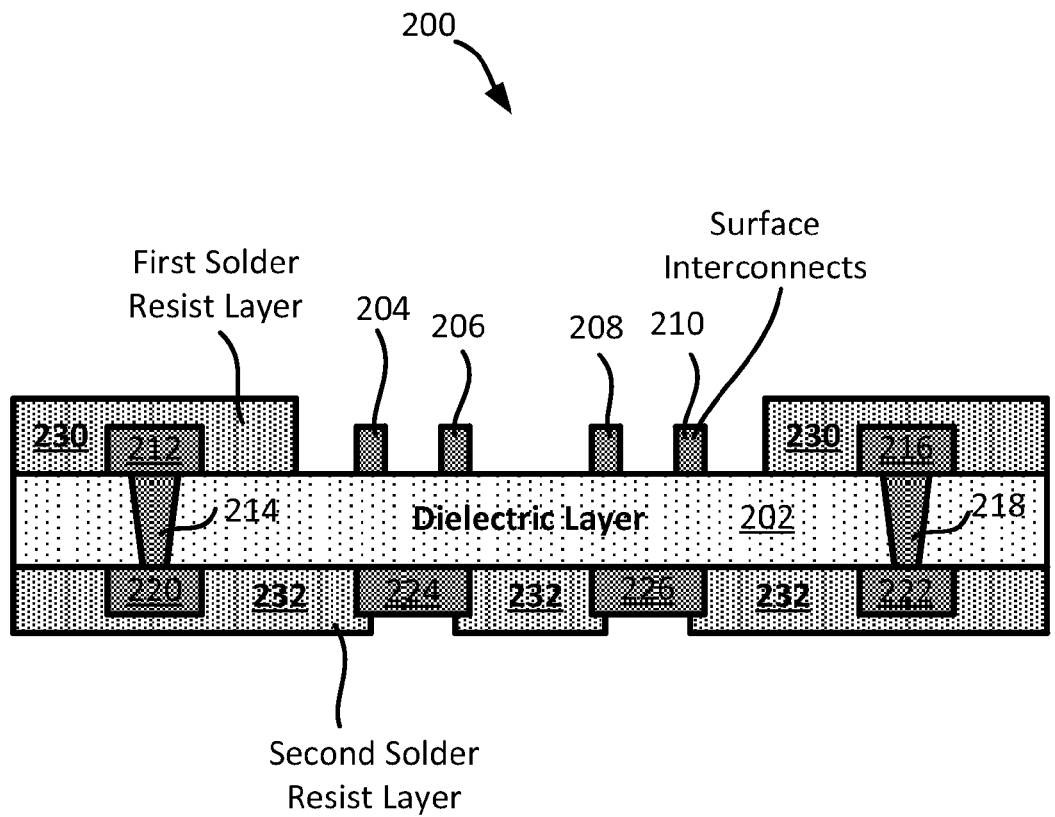
FIG. 2 illustrates another conventional substrate.
Figure 3:
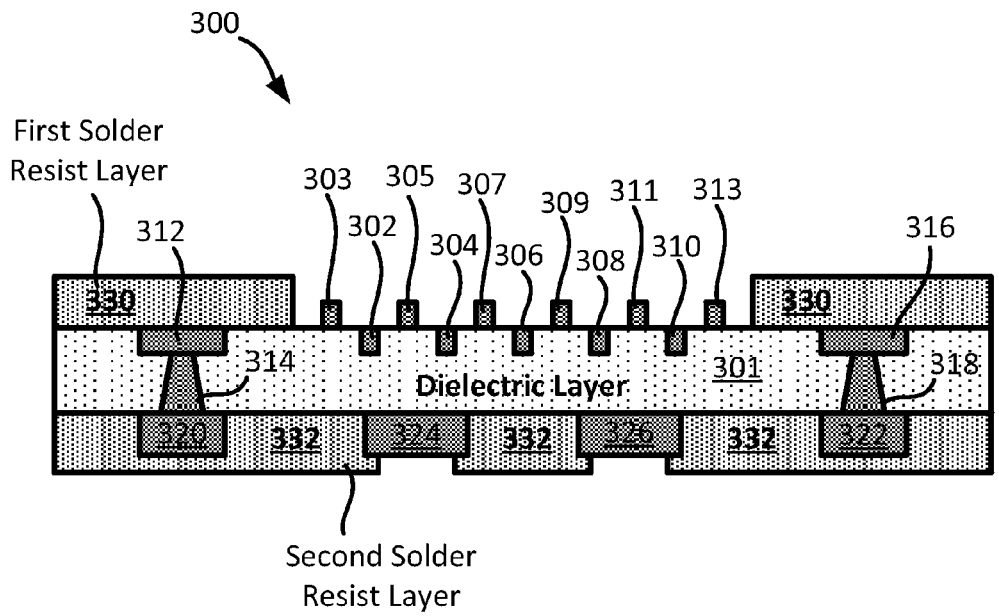
FIG. 3 illustrates an exemplary substrate that includes an embedded interconnect and a surface interconnect.

FIG. 3 illustrates an example of a substrate that includes at least one top interconnect and at least one embedded interconnect. Specifically, FIG. 3 illustrates a substrate 300 that includes a dielectric layer 301, a first interconnect 302, a second interconnect 304, a third interconnect 306, a fourth interconnect 308, a fifth interconnect 310, a sixth interconnect 303, a seventh interconnect 305, an eight interconnect 307, an ninth interconnect 309, a tenth interconnect 311, an eleventh interconnect 313, a first pad 312, a first via 314, a second pad 316, a second via 318, a third pad 320, a fourth pad 322, a fifth pad 324, a sixth pad 326, a first solder resist layer 330, and a second solder resist layer 332. In some implementations, the interconnects are traces (e.g., copper traces).

The first interconnect 302, the second interconnect 304, the third interconnect 306, the fourth interconnect 308, and the fifth interconnect 310 are embedded in the dielectric layer 301. Specifically, the first interconnect 302, the second interconnect 304, the third interconnect 306, the fourth interconnect 308, and the fifth interconnect 310 are embedded in a first surface (e.g., top surface) of the dielectric layer 301. As shown in FIG. 3, portions (e.g., top portions) of the first interconnect 302, the second interconnect 304, the third interconnect 306, the fourth interconnect 308, and the fifth interconnect 310 are exposed and not covered by the dielectric layer 301. In some implementations, the dielectric layer 301 may includes several dielectric layers.

In some implementations, the lateral spacing between two neighboring embedded interconnects (e.g., first interconnect 302 and second interconnect 304) is 15 microns ($\mu m$) or less. Examples of lateral spacing will be further described in FIG. 4.

The sixth interconnect 303, the seventh interconnect 305, the eight interconnect 307, the ninth interconnect 309, the tenth interconnect 311, and the eleventh interconnect 313 are on the first surface (e.g., top surface) of the dielectric layer 301. In some implementations, the sixth interconnect 303, the seventh interconnect 305, the eight interconnect 307, the ninth interconnect 309, the tenth interconnect 311, and the eleventh interconnect 313 are surface interconnects.

In some implementations, the lateral spacing between two neighboring surface interconnects (e.g., sixth interconnect 303 and seventh interconnect 305) is 30 microns ($\mu m$) or less. In some implementations, a spacing (e.g., lateral spacing) defines a distance between edges of two neighboring interconnects (e.g., two neighboring traces). In some implementations, the lateral spacing between a neighboring embedded interconnect and a neighboring surface interconnect (e.g., first interconnect 302 and sixth interconnect 303) is 10 microns ($\mu m$) or less.

In some implementations, the lateral spacing between two neighboring surface interconnects (e.g., sixth interconnect 303 and seventh interconnect 305) is 15 microns ($\mu m$) or less. In some implementations, a spacing (e.g., lateral spacing)

defines a distance between edges of two neighboring interconnects (e.g., two neighboring traces). In some implementations, the lateral spacing between a neighboring embedded interconnect and a neighboring surface interconnect (e.g., first interconnect 302 and sixth interconnect 303) is 5 microns (μm) or less. Examples of lateral spacing will be further described in FIG. 4.

The first pad 312 is coupled to the first via 314. The first pad 312 and the first via 314 are embedded in the dielectric layer 301. The second pad 316 is coupled to the second via 318. The second pad 316 and the second via 316 are embedded in the dielectric layer 301. The third pad 320, the fourth pad 322, the fifth pad 324, and the sixth pad 326 are on a second surface (e.g., bottom surface) of the dielectric layer 301. The third pad 320 is coupled to the first via 314. The fourth pad 322 is coupled to the second via 318.

The first solder resist layer 330 covers a portion of the first surface (e.g., top surface) of the dielectric layer 301. As shown in FIG. 3, the first solder resist layer 322 does not cover the first, second, third and fourth interconnects 304-310. However, in some implementations, the first solder resist layer 330 may cover some or all of the first, second, third and fourth interconnects 304-310.

The second solder resist layer 332 covers a portions the third and fourth pads 320-322, but leaves the fifth and sixth pads 324-326 exposed. However, in some implementations, the second solder resist layer 332 may cover some or all of the third and fourth pads 320-322 and/or fifth and sixth pads 324-326.

Figure 4:
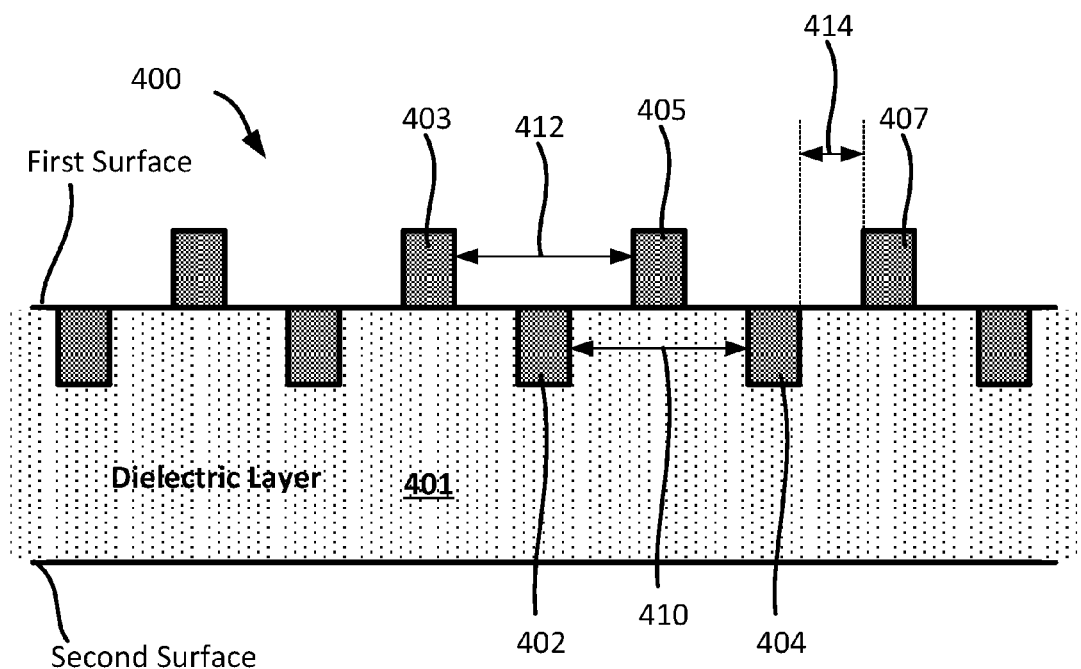
FIG. 4 illustrates a portion of an exemplary substrate that includes an embedded interconnect and a surface interconnect.

FIG. 4 illustrates several lateral spacings of interconnects of a substrate. As shown in FIG. 4, the substrate 400 includes a dielectric layer 401, a first interconnect 402, a second interconnect 404, a third interconnect 403, a fourth interconnect 405, and a fifth interconnect 407. The first interconnect 402 and the second interconnect 404 are embedded in a first surface (e.g., top surface) of the dielectric layer 401. In some implementations, the dielectric layer 401 may includes several dielectric layers. FIG. 4 illustrates that a portion (e.g., top portion) of the first interconnect 402 and the second interconnect 404 is exposed. The third interconnect 403, the fourth interconnect 405, and the fifth interconnect 407 are on the first surface (e.g., top surface) of the dielectric layer 401. FIG. 4 illustrates that portions (e.g., top and side portions) of the third interconnect 403, the fourth interconnect 405, and the fifth interconnect 407 are exposed.

FIG. 4 illustrates a lateral spacing 410 between the first interconnect 402 and the second interconnect 404. The first interconnect 402 and the second interconnect 404 are neighboring embedded interconnects. In some implementations, a spacing (e.g., lateral spacing) defines a distance between edges of two neighboring interconnects (e.g., two neighboring traces).

FIG. 4 also illustrates a lateral spacing 412 between the third interconnect 403 and the fourth interconnect 405. The third interconnect 403 and the fourth interconnect 405 are neighboring surface interconnects.

FIG. 4 further illustrates a lateral spacing 412 between the second interconnect 404 and the fifth interconnect 407. The second interconnect 404 and the fifth interconnect 407 are neighboring embedded interconnect and surface interconnect.

A lateral spacing may also exist between a pad (e.g., surface pad) and a neighboring embedded interconnect. In addition, a lateral spacing may also exist between two neighboring pads. Another lateral spacing may also exist between a pad and a surface pad.

In some implementations, the lateral spacing between two neighboring surface interconnects (e.g., interconnect 403 and interconnect 405) is 30 microns (μm) or less. In some implementations, the lateral spacing between two neighboring embedded interconnects (e.g., interconnect 402 and interconnect 404) is 30 microns (μm) or less. In some implementations, a spacing (e.g., lateral spacing) defines a distance between edges of two neighboring interconnects (e.g., two neighboring traces). In some implementations, the lateral spacing between a neighboring embedded interconnect and a neighboring surface interconnect (e.g., interconnect 404 and interconnect 407) is 10 microns (μm) or less. In some implementations, the lateral spacing between a neighboring pad and a neighboring embedded interconnect is 10 microns (μm) or less. In some implementations, the lateral spacing between a neighboring pad and a neighboring surface interconnect is 30 microns (μm) or less. In some implementations, the lateral spacing between two neighboring pads is 30 microns (μm) or less.

In some implementations, the lateral spacing between two neighboring surface interconnects (e.g., interconnect 403 and interconnect 405) is 15 microns (μm) or less. In some implementations, the lateral spacing between two neighboring embedded interconnects (e.g., interconnect 402 and interconnect 404) is 15 microns (μm) or less. In some implementations, a spacing (e.g., lateral spacing) defines a distance between edges of two neighboring interconnects (e.g., two neighboring traces). In some implementations, the lateral spacing between a neighboring embedded interconnect and a neighboring surface interconnect (e.g., interconnect 404 and interconnect 407) is 5 microns (μm) or less. In some implementations, the lateral spacing between a neighboring pad and a neighboring embedded interconnect is 5 microns (μm) or less. In some implementations, the lateral spacing between a neighboring pad and a neighboring surface interconnect is 15 microns (μm) or less. In some implementations, the lateral spacing between two neighboring pads is 15 microns (μm) or less.

Figure 5:
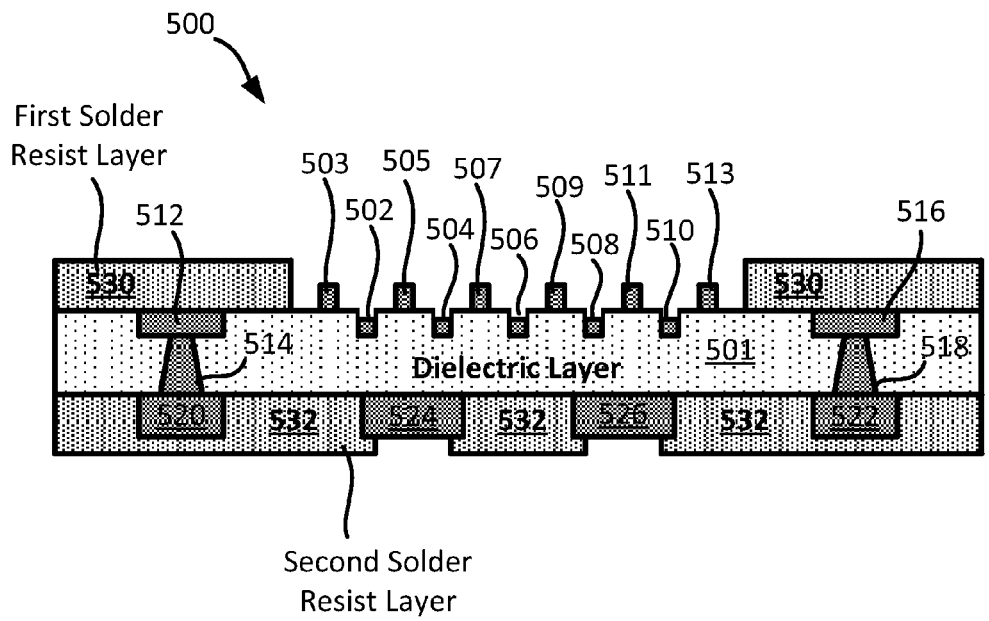
FIG. 5 illustrates an exemplary substrate that includes an embedded interconnect with offset from a surface dielectric and a surface interconnect.

Exemplary Substrate Comprising Offset Embedded Interconnects and Surface Interconnects FIG. 5 illustrates an example of a substrate that includes at least one top interconnect and at least one embedded interconnect. Specifically, FIG. 5 illustrates a substrate 500 that includes a dielectric layer 501, a first interconnect 502, a second interconnect 504, a third interconnect 506, a fourth interconnect 508, a fifth interconnect 510, a sixth interconnect 503, a seventh interconnect 505, an eight interconnect 507, an ninth interconnect 509, a tenth interconnect 511, an eleventh interconnect 513, a first pad 512, a first via 514, a second pad 516, a second via 518, a third pad 520, a fourth pad 522, a fifth pad 524, a sixth pad 526, a first solder resist layer 530, and a second solder resist layer 532. In some implementations, the interconnects are traces (e.g., copper traces).

The first interconnect 502, the second interconnect 504, the third interconnect 506, the fourth interconnect 508, and the fifth interconnect 510 are embedded in the dielectric layer 501. Specifically, the first interconnect 502, the second interconnect 504, the third interconnect 506, the fourth interconnect 508, and the fifth interconnect 510 are embedded in a first surface (e.g., top surface) of the dielectric layer 501. In some implementations, the dielectric layer 501 may includes several dielectric layers. As shown in FIG. 5, portions (e.g., top portions) of the first interconnect 502, the second interconnect 504, the third interconnect 506, the fourth interconnect 508, and the fifth interconnect 510 are exposed and not covered by the dielectric layer 501. As further shown in FIG. 5, of the first interconnect 502, the second interconnect 504, the third interconnect 506, the fourth interconnect 508, and the fifth interconnect 510 are offset embedded interconnects. In some implementations, an offset embedded interconnect is an interconnect that is embedded in a surface of a dielectric (e.g., dielectric layer) and offset from the surface of the dielectric (e.g., dielectric layer). The interconnect is offset towards an inner portion of the first dielectric layer. In some implementations, an inner portion of the dielectric layer is the portion of the dielectric layer that is between a first surface (e.g., top surface) of the dielectric and a second surface (e.g., bottom surface) of the dielectric. In some implementations, an inner portion of the dielectric layer is any portion of the dielectric layer except a surface portion of the dielectric layer. For example, an inner portion of the dielectric layer may include a center portion of the dielectric layer. In some implementations, an offset embedded interconnect is an interconnect that is embedded in a surface of a dielectric (e.g., dielectric layer) and offset from the surface of the dielectric (e.g., dielectric layer) such that a cavity in the dielectric is between the offset first interconnect and the surface of the dielectric.

In some implementations, the lateral spacing between two neighboring embedded interconnects (e.g., first interconnect 502 and second interconnect 504) is 15 microns (μm) or less. Examples of lateral spacing will be further described in FIG. 4.

The sixth interconnect 503, the seventh interconnect 505, the eight interconnect 507, the ninth interconnect 509, the tenth interconnect 511, and the eleventh interconnect 513 are on the first surface (e.g., top surface) of the dielectric layer 501. In some implementations, the sixth interconnect 503, the seventh interconnect 505, the eight interconnect 507, the ninth interconnect 509, the tenth interconnect 511, and the eleventh interconnect 513 are surface interconnects.

In some implementations, the lateral spacing between two neighboring surface interconnects (e.g., sixth interconnect 503 and seventh interconnect 505) is 30 microns (μm) or less. In some implementations, a spacing (e.g., lateral spacing) defines a distance between edges of two neighboring interconnects (e.g., two neighboring traces). In some implementations, the lateral spacing between a neighboring embedded interconnect and a neighboring surface interconnect (e.g., first interconnect 502 and sixth interconnect 503) is 10 microns (μm) or less.

In some implementations, the lateral spacing between two neighboring surface interconnects (e.g., sixth interconnect 503 and seventh interconnect 505) is 15 microns (μm) or less. In some implementations, a spacing (e.g., lateral spacing) defines a distance between edges of two neighboring interconnects (e.g., two neighboring traces). In some implementations, the lateral spacing between a neighboring embedded interconnect and a neighboring surface interconnect (e.g., first interconnect 502 and sixth interconnect 503) is 5 microns (μm) or less. Examples of lateral spacing will be further described in FIG. 6.

The first pad 512 is coupled to the first via 514. The first pad 512 and the first via 514 are embedded in the dielectric layer 501. The second pad 516 is coupled to the second via 518. The second pad 516 and the second via 516 are embedded in the dielectric layer 501. The third pad 520, the fourth pad 522, the fifth pad 524, and the sixth pad 526 are on a second surface (e.g., bottom surface) of the dielectric layer 501. The third pad 520 is coupled to the first via 514. The fourth pad 522 is coupled to the second via 518.

The first solder resist layer 530 covers a portion of the first surface (e.g., top surface) of the dielectric layer 501. As shown in FIG. 5, the first solder resist layer 530 does not cover the first, second, third and fourth interconnects 502, 504, 506, 508 & 510. However, in some implementations, the first solder resist layer 530 may cover some or all of the first, second, third and fourth interconnects 502, 504, 506, 508 & 510.

The second solder resist layer 532 covers a portions the third and fourth pads 520-522, but leaves the fifth and sixth pads 524-526 exposed. However, in some implementations, the second solder resist layer 532 may cover some or all of the third and fourth pads 520-522 and/or fifth and sixth pads 524-526.

Figure 6:
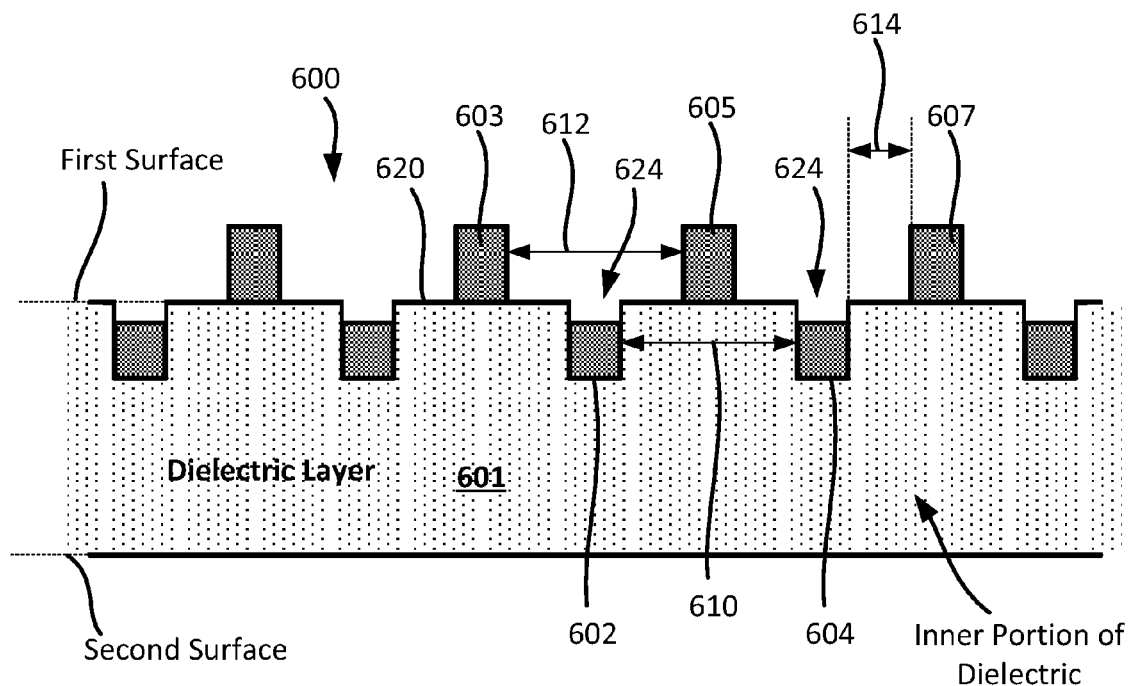
FIG. 6 illustrates a portion of an exemplary substrate that includes an embedded interconnect with offset from a surface dielectric and a surface interconnect.

FIG. 6 illustrates several lateral spacings of interconnects of a substrate. As shown in FIG. 6, the substrate 600 includes a dielectric layer 601, a first interconnect 602, a second interconnect 604, a third interconnect 603, a fourth interconnect 605, and a fifth interconnect 607. The first interconnect 602 and the second interconnect 604 are embedded in a first surface (e.g., top surface) of the dielectric layer 601. In some implementations, the dielectric layer 601 may includes several dielectric layers. FIG. 6 illustrates that a portion (e.g., top portion) of the first interconnect 602 and the second interconnect 604 is exposed. In some implementations, the first interconnect 602 and the second interconnect 604 are offset embedded interconnects.

In some implementations, an offset embedded interconnect is an interconnect that is embedded in a surface of a dielectric (e.g., dielectric layer) and offset from the surface of the dielectric (e.g., dielectric layer). The interconnect is offset towards an inner portion of the first dielectric layer. In some implementations, an inner portion of the dielectric layer is the portion of the dielectric layer that is between a first surface (e.g., top surface) of the dielectric and a second surface (e.g., bottom surface) of the dielectric. In some implementations, an inner portion of the dielectric layer is any portion of the dielectric layer except a surface portion of the dielectric layer. For example, an inner portion of the dielectric layer may include a center portion of the dielectric layer.

In some implementations, an offset embedded interconnect is an interconnect that is embedded in a surface of a dielectric (e.g., dielectric layer) and offset from the surface of the dielectric (e.g., dielectric layer) such that a cavity in the dielectric is between the offset first interconnect and the surface of the dielectric. For example, the first interconnect 602 and the second interconnect 604 are offset from the surface 620 of the dielectric layer 601. Moreover, a first cavity 622 is formed in the dielectric layer 601 above the first offset embedded interconnect 602. Similarly, a second cavity 624 is formed in the dielectric layer 601 above the second offset embedded interconnect 604. In some implementations, offsetting the embedded interconnects from the surface of the dielectric layer 601 further increases the distance between interconnects (e.g., surface interconnects, embedded interconnects), thereby reducing the likelihood of shorting between adjacent interconnects in some implementations.

The third interconnect 603, the fourth interconnect 605, and the fifth interconnect 607 are on the first surface (e.g., top surface) of the dielectric layer 601. FIG. 6 illustrates that portions (e.g., top and side portions) of the third interconnect 603, the fourth interconnect 605, and the fifth interconnect 607 are exposed.

FIG. 6 illustrates a lateral spacing 610 between the first interconnect 602 and the second interconnect 604. The first interconnect 602 and the second interconnect 604 are neighboring embedded interconnects. In some implementations, a spacing (e.g., lateral spacing) defines a distance between edges of two neighboring interconnects (e.g., two neighboring traces).

FIG. 6 also illustrates a lateral spacing 612 between the third interconnect 603 and the fourth interconnect 605. The third interconnect 603 and the fourth interconnect 605 are neighboring surface interconnects.

FIG. 6 further illustrates a lateral spacing 612 between the second interconnect 604 and the fifth interconnect 607. The second interconnect 604 and the fifth interconnect 607 are neighboring embedded interconnect and surface interconnect.

A lateral spacing may also exist between a pad (e.g., surface pad) and a neighboring embedded interconnect. In addition, a lateral spacing may also exist between two neighboring pads. Another lateral spacing may also exist between a pad and a surface pad.

In some implementations, the lateral spacing between two neighboring surface interconnects (e.g., interconnect 603 and interconnect 605) is 30 microns (μm) or less. In some implementations, the lateral spacing between two neighboring embedded interconnects (e.g., interconnect 602 and interconnect 604) is 30 microns (μm) or less. In some implementations, a spacing (e.g., lateral spacing) defines a distance between edges of two neighboring interconnects (e.g., two neighboring traces). In some implementations, the lateral spacing between a neighboring embedded interconnect and a neighboring surface interconnect (e.g., interconnect 604 and interconnect 607) is 10 microns (μm) or less. In some implementations, the lateral spacing between a neighboring pad and a neighboring embedded interconnect is 10 microns (μm) or less. In some implementations, the lateral spacing between a neighboring pad and a neighboring surface interconnect is 30 microns (μm) or less. In some implementations, the lateral spacing between two neighboring pads is 30 microns (μm) or less.

In some implementations, the lateral spacing between two neighboring surface interconnects (e.g., interconnect 603 and interconnect 605) is 15 microns (μm) or less. In some implementations, the lateral spacing between two neighboring embedded interconnects (e.g., interconnect 602 and interconnect 604) is 15 microns (μm) or less. In some implementations, a spacing (e.g., lateral spacing) defines a distance between edges of two neighboring interconnects (e.g., two neighboring traces). In some implementations, the lateral spacing between a neighboring embedded interconnect and a neighboring surface interconnect (e.g., interconnect 604 and interconnect 607) is 5 microns (μm) or less. In some implementations, the lateral spacing between a neighboring pad and a neighboring embedded interconnect is 5 microns (μm) or less. In some implementations, the lateral spacing between a neighboring pad and a neighboring surface interconnect is 15 microns (μm) or less. In some implementations, the lateral spacing between two neighboring pads is 15 microns (μm) or less.

Figure 7:
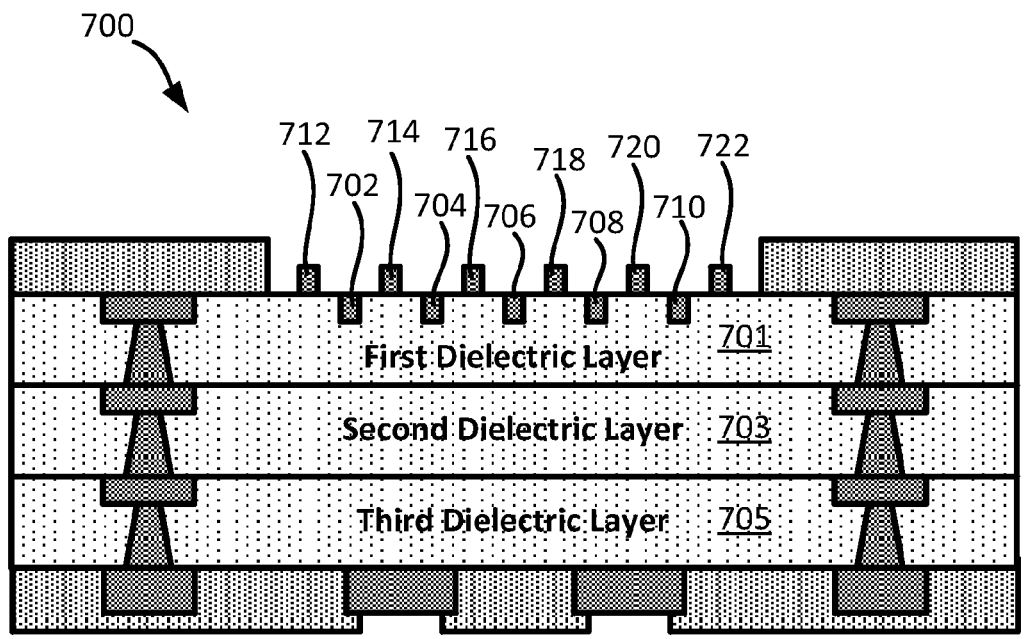
FIG. 7 illustrates an exemplary substrate that includes several dielectric layers, an embedded interconnect, and a surface interconnect.

Exemplary Substrate Comprising Several Dielectric Layers, Embedded Interconnects and Surface Interconnects In some implementations, a substrate may include more than one dielectric layer. FIG. 7 illustrates an example of a substrate that includes three dielectric layers. As shown in FIG. 7, the substrate 700 includes a first dielectric layer 701, a second dielectric layer 703, and a third dielectric layer 705. The substrate 700 also includes a first interconnect 702, a second interconnect 704, a third interconnect 706, a fourth interconnect 708, a fifth interconnect 710, a sixth interconnect 712, a seventh interconnect 714, an eight interconnect 716, a ninth interconnect 718, a tenth interconnect 720, and an eleventh interconnect 722.

The first interconnect 702, the second interconnect 704, the third interconnect 706, the fourth interconnect 708, and the fifth interconnect 710 are embedded in a first surface (e.g., top surface) of the first dielectric layer 701.

The sixth interconnect 712, the seventh interconnect 714, the eight interconnect 716, the ninth interconnect 718, the tenth interconnect 720, and the eleventh interconnect 722 are on the first surface (e.g., top surface) of the first dielectric layer 701.

Figure 8:
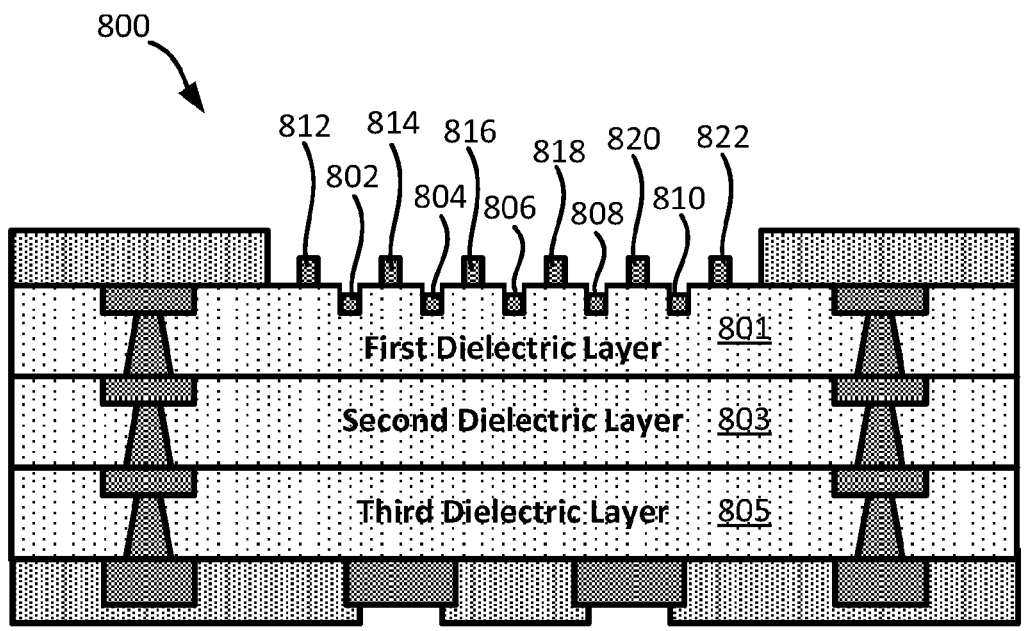
FIG. 8 illustrates an exemplary substrate that includes several dielectric layers, an embedded interconnect with offset from a surface dielectric, and a surface interconnect.

FIG. 8 illustrates an example of a substrate that includes three dielectric layers. As shown in FIG. 8, the substrate 800 includes a first dielectric layer 801, a second dielectric layer 803, and a third dielectric layer 805. The substrate 800 also includes a first interconnect 802, a second interconnect 804, a third interconnect 806, a fourth interconnect 808, a fifth interconnect 810, a sixth interconnect 812, a seventh interconnect 814, an eight interconnect 816, a ninth interconnect 818, a tenth interconnect 820, and an eleventh interconnect 822.

The first interconnect 802, the second interconnect 804, the third interconnect 806, the fourth interconnect 808, and the fifth interconnect 810 are embedded in a first surface (e.g., top surface) of the first dielectric layer 801.

The first interconnect 802, the second interconnect 804, the third interconnect 806, the fourth interconnect 808, and the fifth interconnect 810 are offset embedded interconnects. In some implementations, an offset embedded interconnect is an interconnect that is embedded in a surface of a dielectric (e.g., dielectric layer) and offset from the surface of the dielectric (e.g., dielectric layer). The interconnect is offset towards an inner portion of the first dielectric layer. In some implementations, an inner portion of the dielectric layer is the portion of the dielectric layer that is between a first surface (e.g., top surface) of the dielectric and a second surface (e.g., bottom surface) of the dielectric. In some implementations, an inner portion of the dielectric layer is any portion of the dielectric layer except a surface portion of the dielectric layer. For example, an inner portion of the dielectric layer may include a center portion of the dielectric layer.

In some implementations, an offset embedded interconnect is an interconnect that is embedded in a surface of a dielectric (e.g., dielectric layer) and offset from the surface of the dielectric (e.g., dielectric layer) such that a cavity in the dielectric is between the offset first interconnect and the surface of the dielectric.

The sixth interconnect 812, the seventh interconnect 814, the eight interconnect 816, the ninth interconnect 818, the tenth interconnect 820, and the eleventh interconnect 822 are on the first surface (e.g., top surface) of the first dielectric layer 801.

Figure 9:
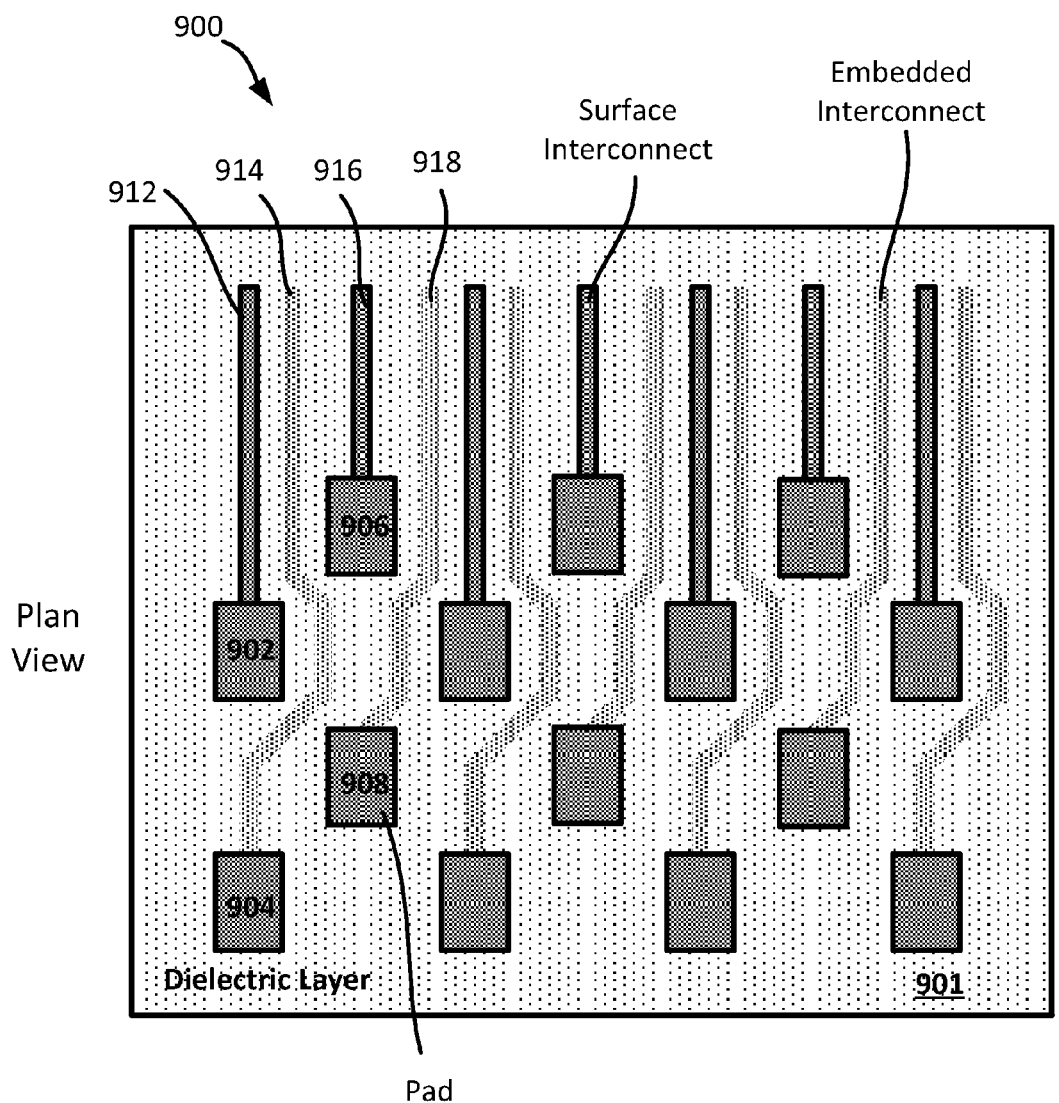
FIG. 9 illustrates a plan view of an exemplary substrate that includes an embedded interconnect, a surface interconnect, and a pad.

Exemplary Substrate Comprising Pads, Embedded Interconnects and Surface Interconnects In some implementations, a substrate may also include one or more pads on the first surface (e.g., top surface) of the first dielectric layer. One or more pads may be coupled to an embedded interconnect and/or surface interconnect. FIG. 9 illustrates a plan view (e.g., top view) of a substrate 900 that includes a dielectric layer 901, several pads (e.g., first pad 902, second pad 904, third pad 906, fourth pad 908), several surface interconnects (e.g., first surface interconnect 912, second surface interconnect 916), and several embedded interconnects (e.g., first embedded interconnect 914, second embedded interconnect 918).

The surface interconnects are located on a first surface (e.g., top surface) of the dielectric layer 901. The embedded interconnects are embedded in the first surface (e.g., top surface) of the dielectric layer 901. The pads (e.g., first pad 902, second pad 904, third pad 906, fourth pad 908) are on the surface of the dielectric layer 901. As shown in FIG. 9, the first surface interconnect 912 is coupled to the first pad 902, and the second surface interconnect 916 is coupled to the third pad 906. FIG. 9 further illustrates that the first embedded interconnect 914 is coupled to the second pad 904, and the second embedded interconnect 918 is coupled to the fourth pad 908.

In some implementations, the substrate may be covered by a solder resist layer (not shown). For example, in some implementations, the solder resist layer may cover some or all of the dielectric layer 901 and/or embedded interconnects. In some implementations, the solder resist layer may cover some or all of the surface interconnects.

Figure 10A:
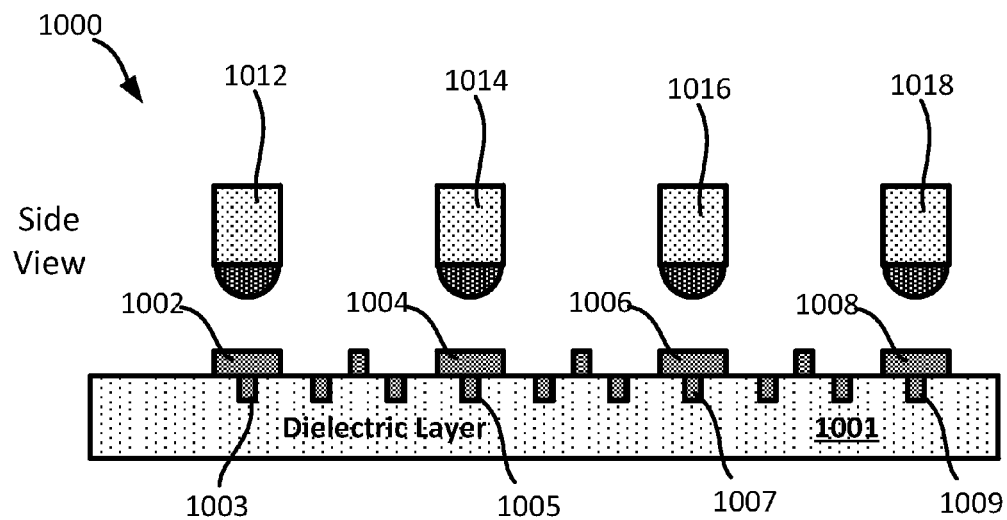
FIG. 10A illustrates a side view of an exemplary substrate that includes an embedded interconnect, a surface interconnect, and a pad.

FIG. 10A illustrates a side view of a substrate 1000 that includes a dielectric layer 1001, embedded interconnects (e.g., first embedded interconnect 1003, second embedded interconnect 1005, third embedded interconnect 1007, fourth embedded interconnect 1009) that are coupled to a first pad 1002, a second pad 1004, a third pad 1006, and a fourth pad 1008. As shown in FIG. 10A, the embedded interconnects (e.g., first embedded interconnect 1003, second embedded interconnect 1005, third embedded interconnect 1007, fourth embedded interconnect 1009) are located in the dielectric layer 1001. The first, second, third, and fourth pads 1002, 1004, 1006, 1008 are configured to respectively couple to a first bump 1012, a second bump 1014, a third bump 1016, and a fourth bump 1018. Each of the bumps 1012-1018 is coupled to a die (e.g., same die or different die).

Figure 10B:
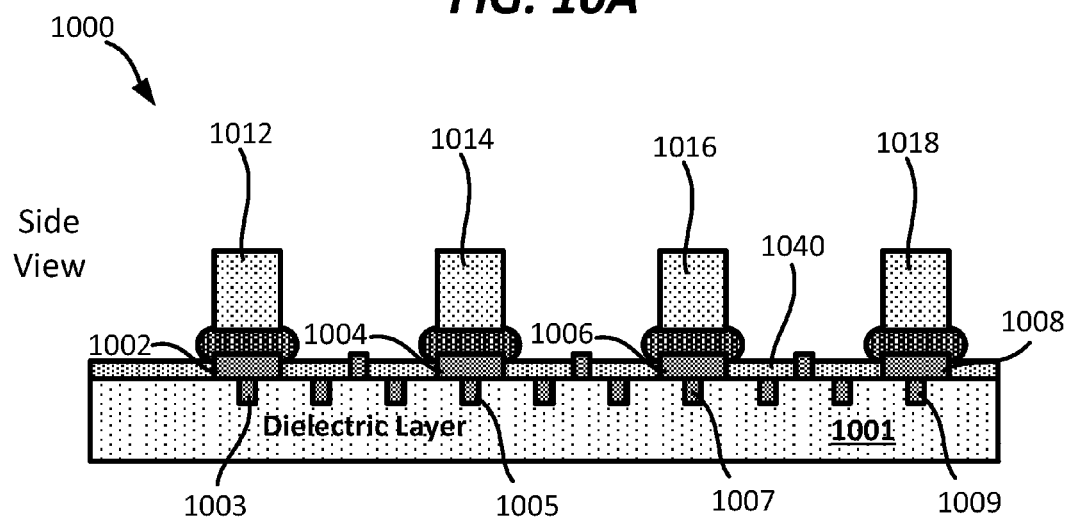
FIG. 10B illustrates a side view of an exemplary substrate that includes an embedded interconnect, a surface interconnect, and a pad coupled to the embedded interconnect.

FIG. 10B illustrates a substrate after several bumps 1012-1018 are coupled to pads 1002-1008. As shown in FIG. 10B, the lateral spacing between the pads and the interconnects (e.g., surface interconnects, embedded interconnects), allows the bumps 1012-1018 (bumps may include solder balls) to couple to the pads 1002-1008 while minimizing and/or avoiding shorting of neighboring interconnects (e.g., traces).

FIG. 10B also illustrates a solder resist layer 1040. The solder resist layer 1040 may be provided on the substrate such that the solder resist layer 1040 covers the embedded interconnects (e.g., embedded interconnects 1003, 1005, 1007, 1009). As further shown in FIG. 10B, the solder resist layer 1040 is provided such that the surface interconnects and the pads (e.g., pads 1002, 1004, 1006, 1008) are exposed to an environment. The solder resist layer 1040 may be provided before one or more dies are coupled to the substrate. In some implementations, the solder resist layer 1040 is optional.

Figure 11A:
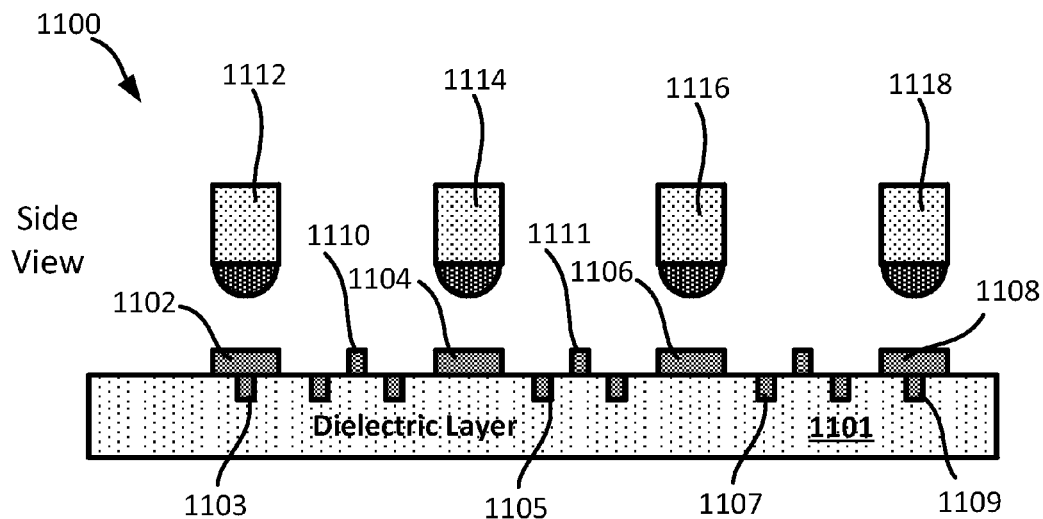
FIG. 11A illustrates a side view of an exemplary substrate that includes an embedded interconnect, a surface interconnect, and a pad.

In some implementations, one or more pads may be coupled to an embedded interconnect and/or surface interconnect. FIG. 11A illustrates a side view of a substrate 1100 that includes a dielectric layer 1101, pads (e.g., first pad 1102, a second pad 1104, a third pad 1106, and a fourth pad 1108), embedded interconnects (e.g., first embedded interconnect 1103, second embedded interconnect 1105, third embedded interconnect 1107, fourth embedded interconnect 1109), and surface interconnects (e.g., first surface interconnect 1110, second surface interconnect 1111).

As shown in FIG. 11A, the embedded interconnects (e.g., first embedded interconnect 1103, second embedded interconnect 1105, third embedded interconnect 1107, fourth embedded interconnect 1109) are embedded in a first surface (e.g., top surface) of the dielectric layer 1101. The surface interconnects (e.g., first embedded interconnect 1110, second embedded interconnect 1111) are located on a first surface (e.g., top surface) of the dielectric layer 1101. The first, second, third, and fourth pads 1102, 1104, 1106, 1108 are located on a first surface (e.g., top surface) of the dielectric layer 1101.

The first pad 1102 is coupled to the first embedded interconnect 1103. The second pad 1104 is coupled to a surface interconnect (not visible). The third pad 1106 is coupled is coupled to another surface interconnect (not visible). The fourth pad 1108 is coupled to a fourth embedded interconnect 1109. The first, second, third, and fourth pads 1102, 1104, 1106, 1108 are configured to respectively couple to a first bump 1112, a second bump 1114, a third bump 1116, and a fourth bump 1118. Each of the bumps 1112-1118 is coupled to a die (e.g., same die or different die).

Figure 11B:
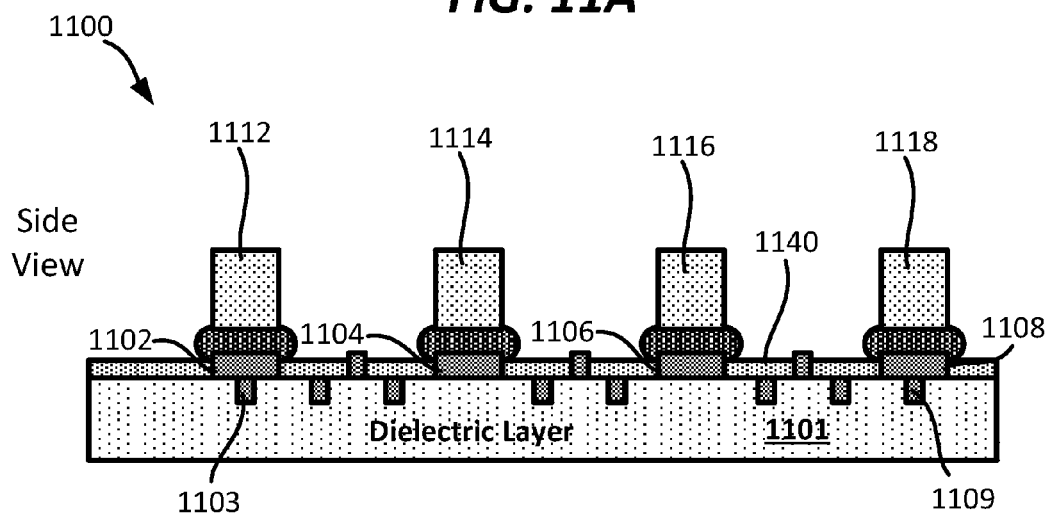
FIG. 11B illustrates a side view of an exemplary substrate that includes an embedded interconnect, a surface interconnect, a first pad coupled to the surface interconnect, and a second pad coupled to the embedded interconnect.

FIG. 11B illustrates a substrate after several bumps 1112-1118 are coupled to pads 1102-1108. As shown in FIG. 11B, the lateral spacing between the pads and the interconnects (e.g., surface interconnects, embedded interconnects), allows the bumps 1112-1118 (bumps may include solder balls) to couple to the pads 1102-1108 while minimizing and/or avoiding shorting of neighboring interconnects (e.g., traces).

FIG. 11B also illustrates a solder resist layer 1140. The solder resist layer 1040 may be provided on the substrate such that the solder resist layer 1140 covers the embedded interconnects (e.g., embedded interconnects 1103, 1105, 1107, 1109). As further shown in FIG. 11B, the solder resist layer 1140 is provided such that the surface interconnects and the pads (e.g., pads 1102, 1104, 1106, 1108) are exposed to an environment. The solder resist layer 1140 may be provided before one or more dies are coupled to the substrate. In some implementations, the solder resist layer 1040 is optional.

Figure 12A:
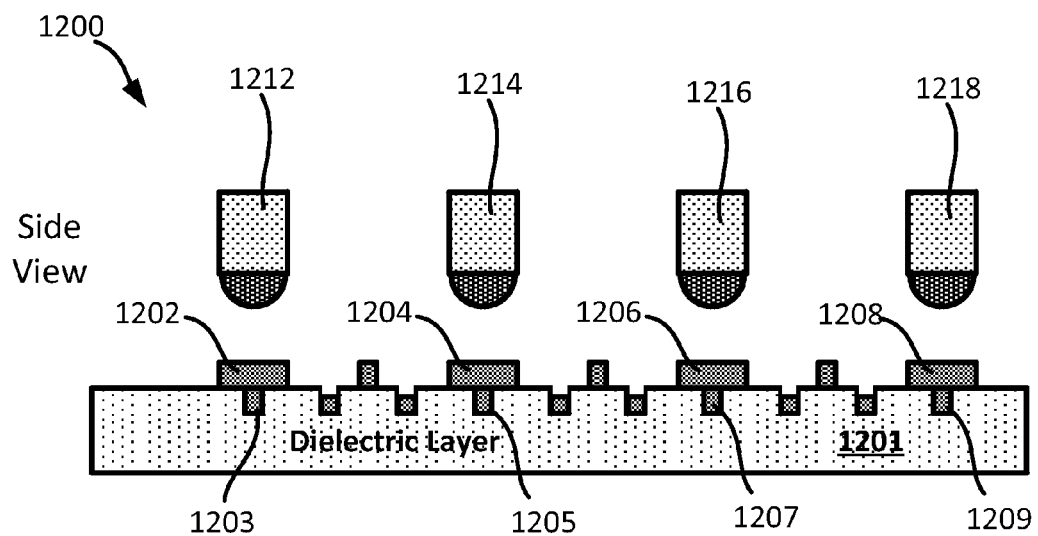
FIG. 12A illustrates a side view of an exemplary substrate that includes an embedded interconnect, a surface interconnect, and a pad.

FIG. 12A illustrates a side view of a substrate 1200 that includes a dielectric layer 1201, embedded interconnects (e.g., first embedded interconnect 1203, second embedded interconnect 1205, third embedded interconnect 1207, fourth embedded interconnect 1209) that are coupled to a first pad 1202, a second pad 1204, a third pad 1206, and a fourth pad 1208. As shown in FIG. 12A, the embedded interconnects (e.g., first embedded interconnect 1203, second embedded interconnect 1205, third embedded interconnect 1207, fourth embedded interconnect 1209) are located in the dielectric layer 1201. The first, second, third, and fourth pads 1202, 1204, 1206, 1208 are configured to respectively couple to a first bump 1212, a second bump 1214, a third bump 1216, and a fourth bump 1218. Each of the bumps 1212-1218 is coupled to a die (e.g., same die or different die). FIG. 12A also illustrates a first offset embedded interconnect 1220, a second offset embedded interconnect 1222, a third offset embedded interconnect 1224, a fourth offset embedded interconnect 1226, a fifth offset embedded interconnect 1228, and a sixth offset embedded interconnect 1230.

In some implementations, an offset embedded interconnect is an interconnect that is embedded in a surface of a dielectric (e.g., dielectric layer) and offset from the surface of the dielectric (e.g., dielectric layer). The interconnect is offset towards an inner portion of the first dielectric layer. As shown in FIG. 12A, the offset embedded interconnects 1220-1230 are embedded in the dielectric layer 1201 and are offset towards an inner portion of the dielectric layer 1201. In some implementations, an inner portion of the dielectric layer is the portion of the dielectric layer that is between a first surface (e.g., top surface) of the dielectric and a second surface (e.g., bottom surface) of the dielectric. In some implementations, an inner portion of the dielectric layer is any portion of the dielectric layer except a surface portion of the dielectric layer. For example, an inner portion of the dielectric layer may include a center portion of the dielectric layer.

In some implementations, an offset embedded interconnect is an interconnect that is embedded in a surface of a dielectric (e.g., dielectric layer) and offset from the surface of the dielectric (e.g., dielectric layer) such that a cavity in the dielectric is between the offset first interconnect and the surface of the dielectric.

Figure 12B:
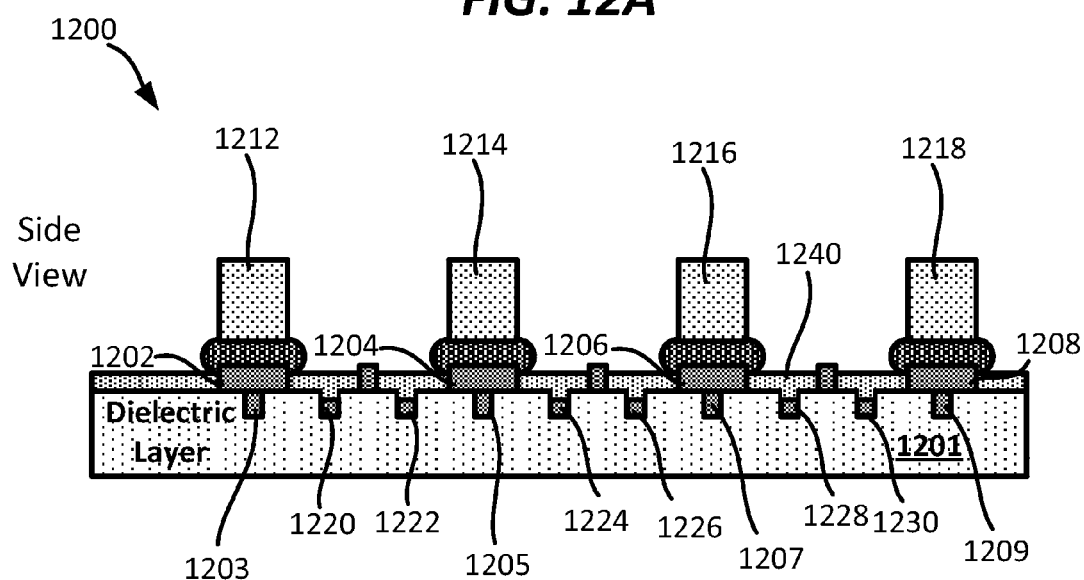
FIG. 12B illustrates a side view of an exemplary substrate that includes an embedded interconnect, a surface interconnect, and a pad coupled to the embedded interconnect.

FIG. 12B illustrates a substrate after several bumps 1212-1218 are coupled to pads 1202-1208. As shown in FIG. 12B, the lateral spacing between the pads and the interconnects (e.g., surface interconnects, embedded interconnects), allows the bumps 1212-1218 (bumps may include solder balls) to couple to the pads 1202-1208 while minimizing and/or avoiding shorting of neighboring interconnects (e.g., traces). In some implementations, offsetting the embedded interconnects from the surface of the dielectric layer 1201 further increases the distance between interconnects (e.g., surface interconnects, embedded interconnects) and/or pads, thereby reducing the likelihood of shorting between adjacent interconnects and/or pads, due to the solder spilling over.

FIG. 12B also illustrates a solder resist layer 1240. The solder resist layer 1240 may be provided on the substrate such that the solder resist layer 1240 covers the embedded interconnects (e.g., embedded interconnects 1203, 1205, 1207, 1209). As further shown in FIG. 12B, the solder resist layer 1240 is provided such that the surface interconnects and the pads (e.g., pads 1202, 1204, 1206, 1208) are exposed to an environment. The solder resist layer 1240 may be provided before one or more dies are coupled to the substrate. In some implementations, the solder resist layer 1240 is optional.

Figure 13A:
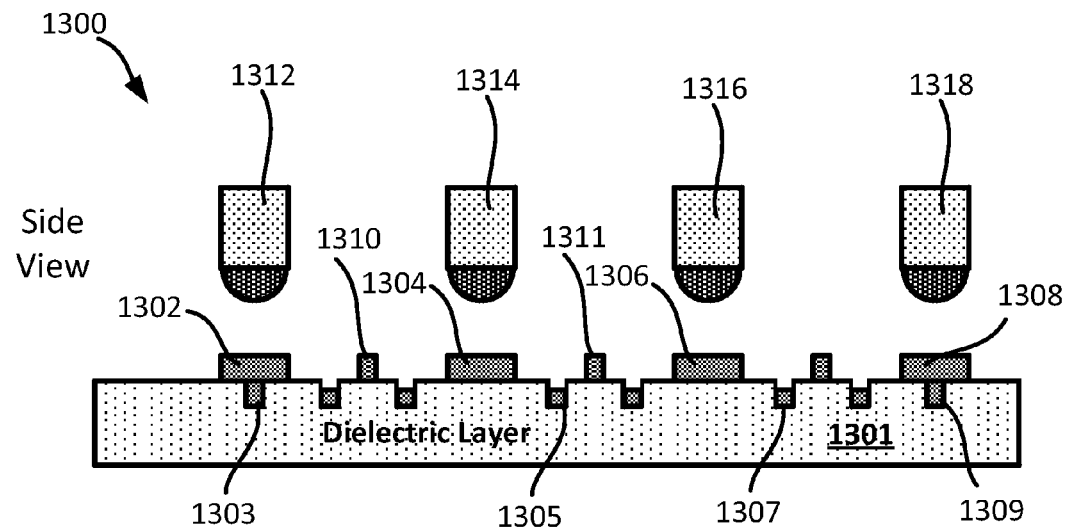
FIG. 13A illustrates a side view of an exemplary substrate that includes an embedded interconnect, a surface interconnect, and a pad.

In some implementations, one or more pads may be coupled to an embedded interconnect and/or surface interconnect. FIG. 13A illustrates a side view of a substrate 1300 that includes a dielectric layer 1301, pads (e.g., first pad 1302, a second pad 1304, a third pad 1306, and a fourth pad 1308), embedded interconnects (e.g., first embedded interconnect 1303, second embedded interconnect 1305, third embedded interconnect 1307, fourth embedded interconnect 1309), and surface interconnects (e.g., first surface interconnect 1310, second surface interconnect 1311).

As shown in FIG. 13A, the embedded interconnects (e.g., first embedded interconnect 1303, second embedded interconnect 1305, third embedded interconnect 1307, fourth embedded interconnect 1309) are embedded in a first surface (e.g., top surface) of the dielectric layer 1301. The surface interconnects (e.g., first embedded interconnect 1310, second embedded interconnect 1311) are located on a first surface (e.g., top surface) of the dielectric layer 1301. The first, second, third, and fourth pads 1302, 1304, 1306, 1308 are located on a first surface (e.g., top surface) of the dielectric layer 1301.

FIG. 13A also illustrates a first offset embedded interconnect 1320, a second offset embedded interconnect 1322, a third offset embedded interconnect 1324, a fourth offset embedded interconnect 1326, a fifth offset embedded interconnect 1328, and a sixth offset embedded interconnect 1330.

In some implementations, an offset embedded interconnect is an interconnect that is embedded in a surface of a dielectric (e.g., dielectric layer) and offset from the surface of the dielectric (e.g., dielectric layer). The interconnect is offset towards an inner portion of the first dielectric layer. As shown in FIG. 13A, the offset embedded interconnects 1320-1330 are embedded in the dielectric layer 1301 and are offset towards an inner portion of the dielectric layer 1301. In some implementations, an inner portion of the dielectric layer is the portion of the dielectric layer that is between a first surface (e.g., top surface) of the dielectric and a second surface (e.g., bottom surface) of the dielectric. In some implementations, an inner portion of the dielectric layer is any portion of the dielectric layer except a surface portion of the dielectric layer. For example, an inner portion of the dielectric layer may include a center portion of the dielectric layer.

In some implementations, an offset embedded interconnect is an interconnect that is embedded in a surface of a dielectric (e.g., dielectric layer) and offset from the surface of the dielectric (e.g., dielectric layer) such that a cavity in the dielectric is between the offset first interconnect and the surface of the dielectric.

The first pad 1302 is coupled to the first embedded interconnect 1303. The second pad 1304 is coupled to a surface interconnect (not visible). The third pad 1306 is coupled is coupled to another surface interconnect (not visible). The fourth pad 1308 is coupled to a fourth embedded interconnect 1309. The first, second, third, and fourth pads 1302, 1304, 1306, 1308 are configured to respectively couple to a first bump 1312, a second bump 1314, a third bump 1316, and a fourth bump 1318. Each of the bumps 1312-1318 is coupled to a die (e.g., same die or different die).

Figure 13B:
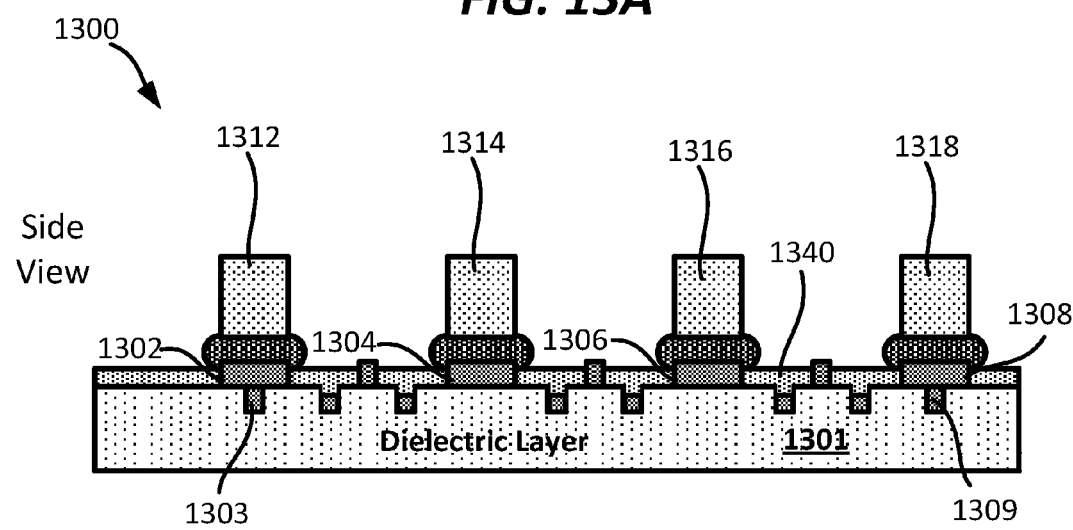
FIG. 13B illustrates a side view of an exemplary substrate that includes an embedded interconnect, a surface interconnect, a first pad coupled to the surface interconnect, and a second pad coupled to the embedded interconnect.

FIG. 13B illustrates a substrate after several bumps 1312-1318 are coupled to pads 1302-1308. As shown in FIG. 13B, the lateral spacing between the pads and the interconnects (e.g., surface interconnects, embedded interconnects), allows the bumps 1312-1318 (bumps may include solder balls) to couple to the pads 1302-1308 while minimizing and/or avoiding shorting of neighboring interconnects (e.g., traces). In some implementations, offsetting the embedded interconnects from the surface of the dielectric layer 1301 further increases the distance between interconnects (e.g., surface interconnects, embedded interconnects) and/or pads, thereby reducing the likelihood of shorting between adjacent interconnects and/or pads, due to the solder spilling over.

FIG. 13B also illustrates a solder resist layer 1340. The solder resist layer 1340 may be provided on the substrate such that the solder resist layer 1340 covers the embedded interconnects (e.g., embedded interconnects 1303, 1305, 1307, 1309). As further shown in FIG. 13B, the solder resist layer 1340 is provided such that the surface interconnects and the pads (e.g., pads 1302, 1304, 1306, 1308) are exposed to an environment. The solder resist layer 1340 may be provided before one or more dies are coupled to the substrate. In some implementations, the solder resist layer 1340 is optional.

Exemplary Sequence for Providing/Manufacturing a Substrate that Includes Embedded Interconnects and/or Surface Interconnects FIGS. 14A-14G illustrate an exemplary sequence for providing/manufacturing a substrate (e.g., package substrate) that includes embedded interconnects and/or surface interconnects. It should be noted that for the purpose of clarity and simplification, the sequence of FIGS. 14A-14G do not necessarily include all the steps and/or stages of providing/manufacturing a substrate that includes one or more embedded interconnects and/or surface interconnects. Moreover, in some instances, several steps and/or stages may have been combined into a single step and/or stage in order to simplify the description of the sequences.

Figure 14A:
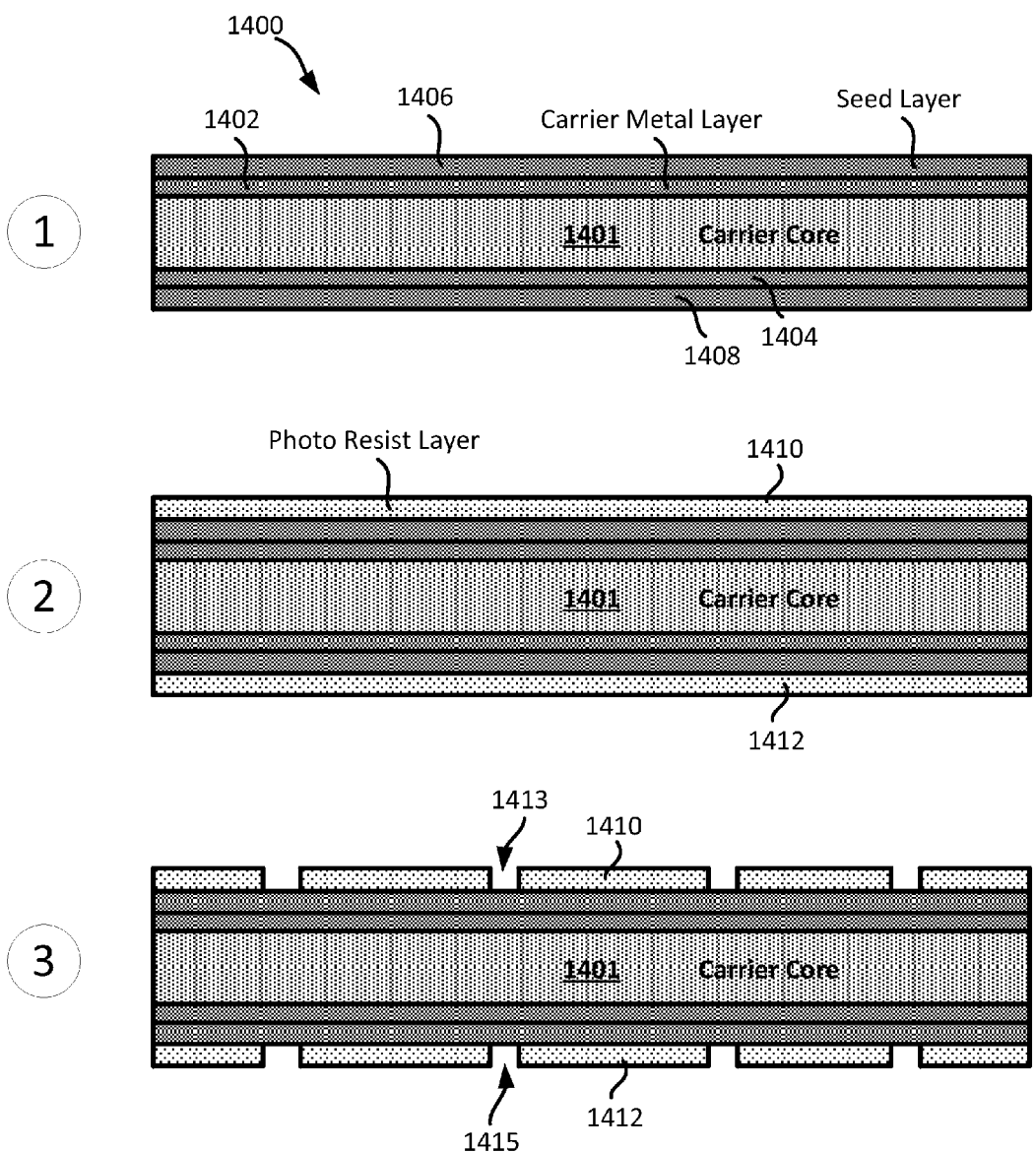
FIGS. 14A-14G illustrate an exemplary sequence for providing a substrate that includes an embedded interconnect, a surface interconnect, and/or a pad.

As shown in FIG. 14A, a carrier substrate 1400 is provided (at stage 1). The carrier substrate 1400 may include a carrier core 1401, a first carrier metal layer 1402, a second metal layer 1404, a first seed layer 1406, and a second seed layer 1408. In some implementations, the carrier core 1401 is a dielectric layer (e.g., cured dielectric layer). The first carrier metal layer 1402 is on a first surface (e.g., top surface) of the carrier core 1401. The second carrier metal layer 1404 is on a second surface (e.g., bottom surface) of the carrier core 1401. In some implementations, the first carrier metal layer 1402 and the second carrier metal layer 1404 are a copper layer. The first seed layer 1406 is on the first carrier metal 1402. The second seed layer 1408 is on the second carrier metal 1404. In some implementations, the first and second seed layers 1406-1408 are copper layers.

A first photo resist layer 1410 and a second photo resist layer 1412 are provided (at stage 2) on the carrier substrate 1400. Specifically, the first photo resist layer 1410 is provided on the first seed layer 1406 and the second photo resist layer 1412 is provided on the second seed layer 1408.

The first and second photo resist layers 1410-1412 may be selectively etched (at stage 3) to selectively remove some of the photo resist layers 1410-1412. Different implementations may use different processes to etch the first and second photo resist layers 1410-1412. In some implementations, etching the first and second photo resist layers 1410-1412 may create one or more cavities (e.g., first cavity 1413, second cavity 1415) in the first and second photo resist layer 1410-1412. For example, etching the first photo resist layer 1410 creates a first cavity 1413 in the first photo resist layer 1410, and etching the second photo resist layer 1412 creates a second cavity 1415 in the second photo resist layer 1412.

Figure 14B:
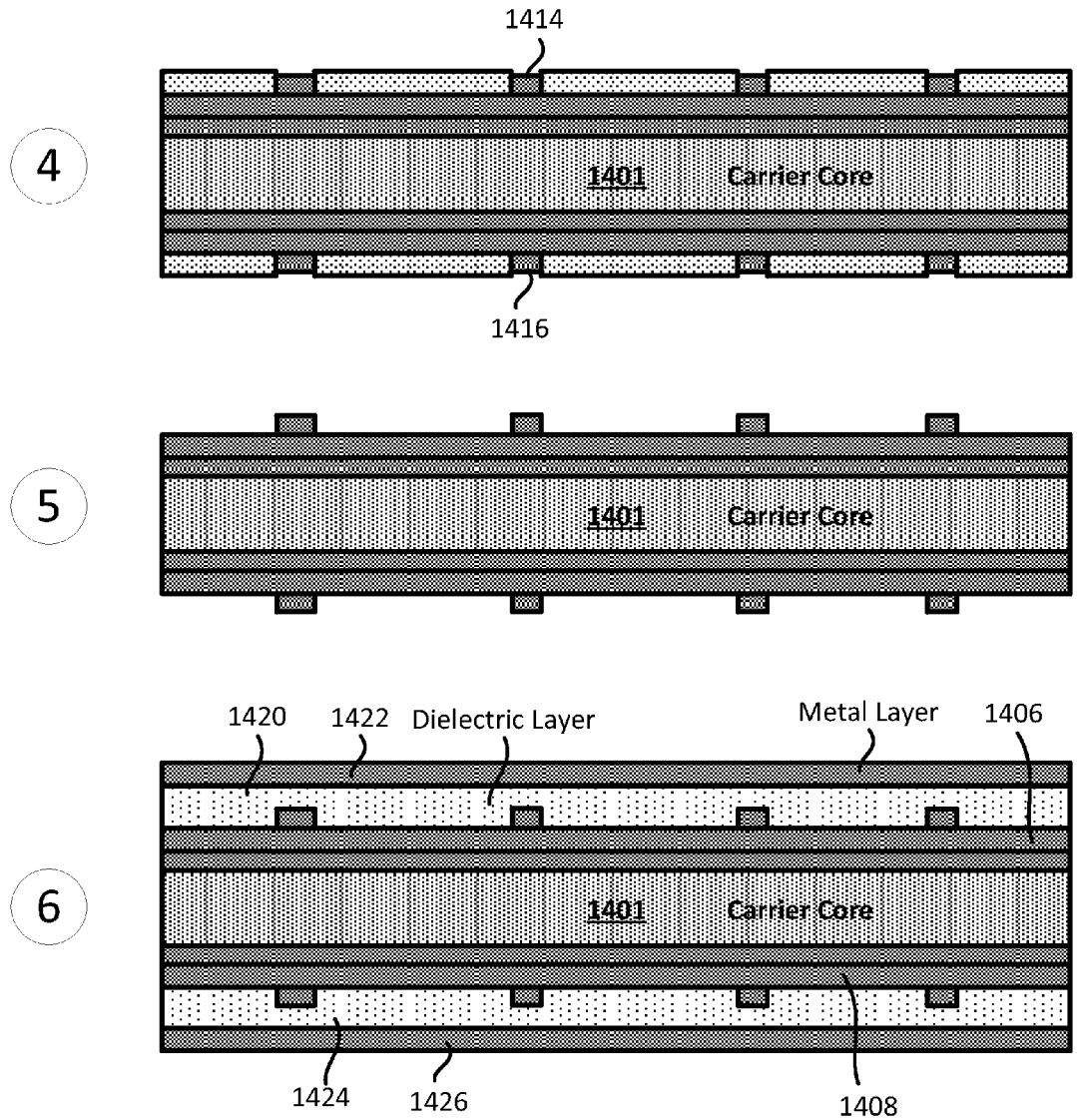

As shown in FIG. 14B, a first metal layer and a second metal layer are provided (at stage 4) on the carrier substrate 1400. In some implementations, the first metal layer is provided in the cavities of the first photo resist layer 1410. For example, the first metal layer 1414 is provided in the first cavity 1413. In some implementations, the first metal layer is a metal plating layer (e.g., copper plating layer). In some implementations, the second metal layer is provided in the cavities of the second photo resist layer 1412. For example, the second metal layer 1416 is provided in the second cavity 1415. In some implementations, the second metal layer is a metal plating layer (e.g., copper plating layer).

The first and second photo resist layers 1410-1412 are removed (at stage 5). Different implementations may use different processes for removing the first and second photo resist layers 1410-1412. As shown at stage 5, removing the first and second photo resist layers 1410-1412 leaves the first metal layer 1414 and the second metal layer 1416 on the carrier substrate 1400.

A first dielectric layer 1420 and a metal layer 1422 are provided (at stage 6) on a first surface (e.g., top surface) of the carrier substrate 1400. In some implementations, the first dielectric layer 1420 covers some or all of the first metal layer 1414. In some implementations, the first dielectric layer 1420 covers some or the entire first seed layer 1406. A second dielectric layer 1424 and a metal layer 1426 are also provided (at stage 6) on a second surface (e.g., bottom surface) of the carrier substrate 1400. In some implementations, the second dielectric layer 1424 covers some or all of the second metal layer 1416. In some implementations, the second dielectric layer 1424 covers some or the entire second seed layer 1408.

Figure 14C:
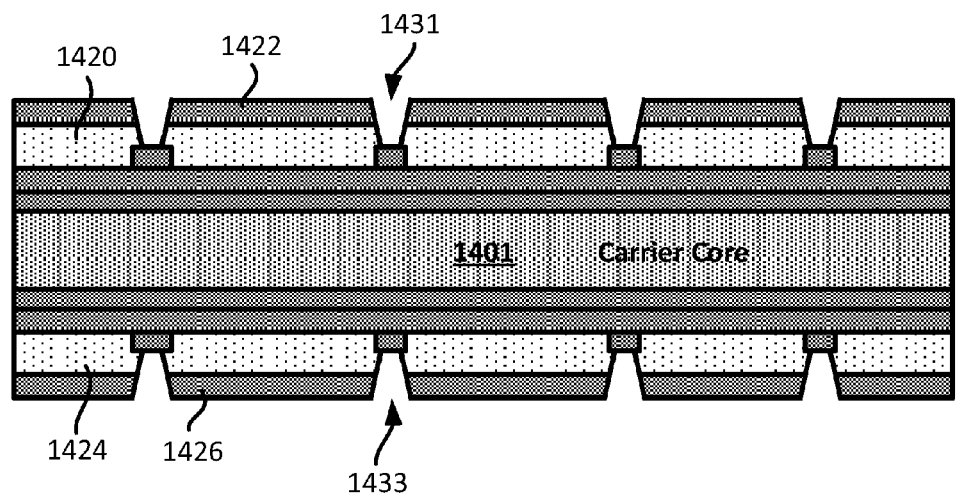
Figure 14C:
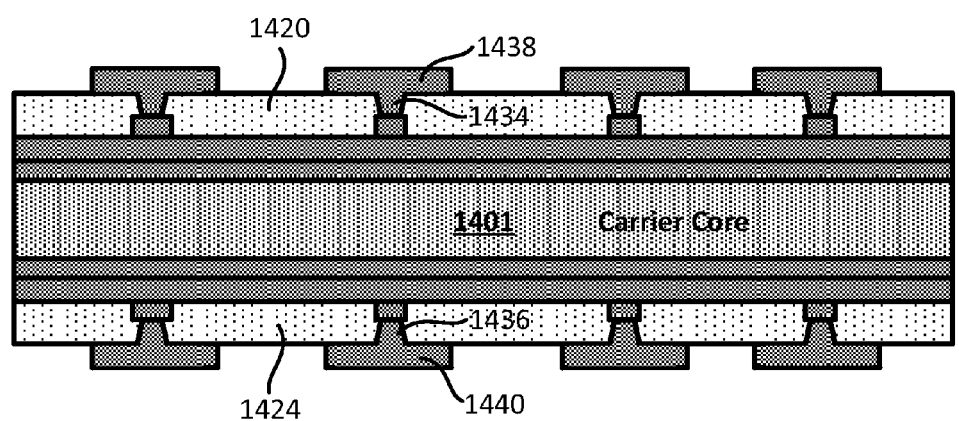

As shown in FIG. 14C, the first dielectric layer 1420 and the metal layer 1422 may be selectively etched (at stage 7) to selectively remove some of the first dielectric layer 1420 and the metal layer 1422. Different implementations may use different processes to etch the first dielectric layer 1420 and the metal layer 1422. In some implementations, etching the first dielectric layer 1420 and the metal layer 1422 may create one or more cavities (e.g., cavity 1431) in the first dielectric layer 1420 and the metal layer 1422. In some implementations, the created cavities are via cavities. For example, etching the first dielectric layer 1420 and the metal layer 1422 creates the cavity 1431 in the first dielectric layer 1420 and the metal layer 1422.

As further shown in FIG. 14C, the second dielectric layer 1424 and the metal layer 1426 may be selectively etched (at stage 7) to selectively remove some of the second dielectric layer 1424 and the metal layer 1426. Different implementations may use different processes to etch the second dielectric layer 1424 and the metal layer 1426. In some implementations, etching the second dielectric layer 1424 and the metal layer 1426 may create one or more cavities (e.g., cavity 1433) in the second dielectric layer 1424 and the metal layer 1426. In some implementations, the created cavities are via cavities. For example, etching the second dielectric layer 1424 and the metal layer 1426 creates the cavity 1433 in the second dielectric layer 1424 and the metal layer 1426.

At stage 8, a patterning process is provided on the carrier substrate 1400. In some implementations, patterning includes providing a metal layer in the cavities (e.g., first cavity 1431, second cavity 1433), which may define one or more via cavities. For example, filling the via cavity 1431 with a metal layer (e.g., copper layer) provides a first via 1434 in the first dielectric layer 1420, and filling the via cavity 1433 with a metal layer (e.g., copper layer) provides a second via 1436 in the second dielectric layer 1424. In addition, patterning (at stage 8) may include creating one more via pads by selectively etching the metal layers 1422 and 1426. For example, selectively etching the metal layer 1422 may create a first via pad 1438. The first via pad 1438 is coupled to the first via 1434. In some implementations, selectively etching the metal layer 1426 may create a second via pad 1440. The second via pad 1440 is coupled to the second via 1436.

Figure 14D:
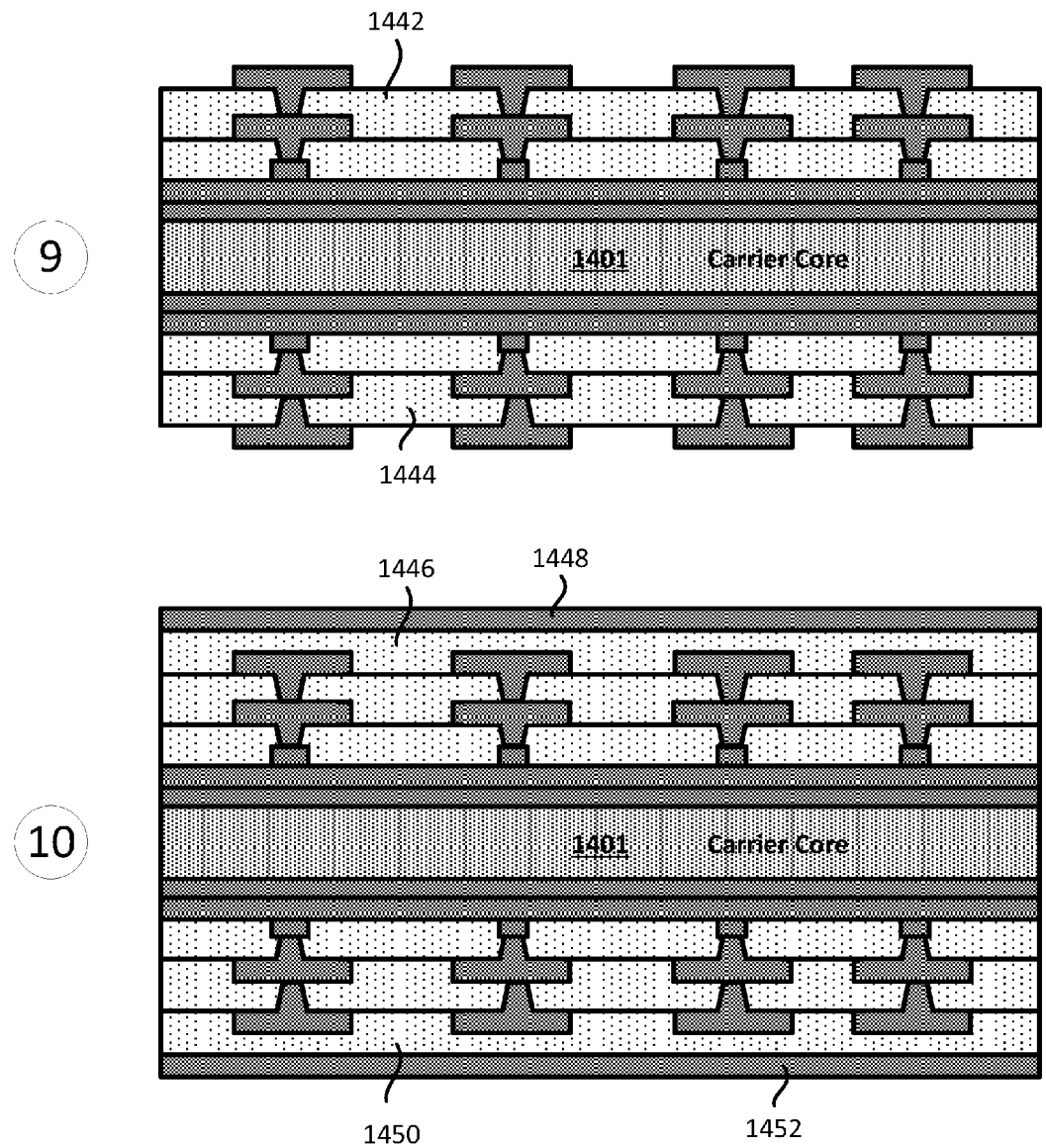

In some implementations, stages 7 and 8 may be repeated several times (e.g., more than once) to create several dielectric layers, vias, and/or pads in the carrier substrate 1400. Stage 9 of FIG. 14D illustrates additional dielectric layers, vias, and/or pads being provided on the carrier substrate 1400. Stage 9 of FIG. 14D illustrates the carrier substrate 1400 after the process of stages 7 and 8 being applied again in some implementations. As shown in stage 9, a third dielectric layer 1442 and a fourth dielectric layer 1444 are provided.

A fifth dielectric layer 1446 and a metal layer 1448 are provided (at stage 10) on a first surface (e.g., top surface) of the carrier substrate 1400. A sixth dielectric layer 1450 and a metal layer 1452 are also provided (at stage 10) on a second surface (e.g., bottom surface) of the carrier substrate 1400.

Figure 14E:
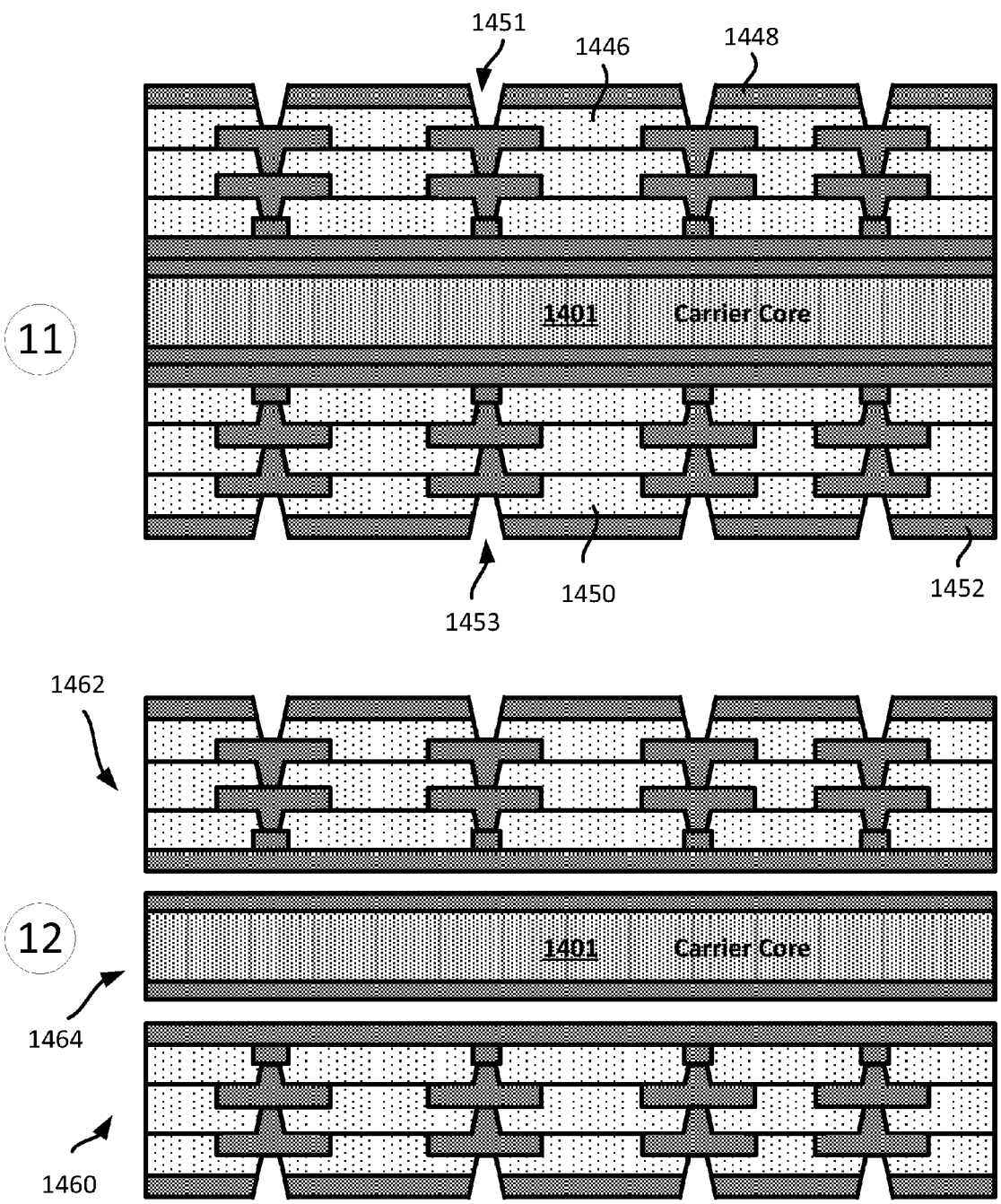

As shown in FIG. 14E, the fifth dielectric layer 1446 and the metal layer 1448 may be selectively etched (at stage 11) to selectively remove some of the fifth dielectric layer 1446 and the metal layer 1448. Different implementations may use different processes to etch the fifth dielectric layer 1446 and the metal layer 1448. In some implementations, etching the fifth dielectric layer 1446 and the metal layer 1448 may create one or more cavities (e.g., cavity 1451) in the fifth dielectric layer 1446 and the metal layer 1448. In some implementations, the created cavities are via cavities. For example, etching the fifth dielectric layer 1446 and the metal layer 1448 creates the cavity 1451 in the fifth dielectric layer 1446 and the metal layer 1448.

FIG. 14E also illustrates that the sixth dielectric layer 1450 and the metal layer 1452 may be selectively etched (at stage 11) to selectively remove some of the sixth dielectric layer 1450 and the metal layer 1452. Different implementations may use different processes to etch the sixth dielectric layer 1450 and the metal layer 1452. In some implementations, etching the sixth dielectric layer 1450 and the metal layer 1452 may create one or more cavities (e.g., cavity 1453) in the sixth dielectric layer 1450 and the metal layer 1452. In some implementations, the created cavities are via cavities. For example, etching the sixth dielectric layer 1450 and the metal layer 1452 creates the cavity 1453 in the sixth dielectric layer 1450 and the metal layer 1452.

In some implementations, the carrier substrate 1400 is separated (at stage 12) into two or more parts. For example, in some implementations, the carrier substrate 1400 is separated into three parts, a first substrate 1460, a second substrate 1462, and a third substrate 1464. The third substrate 1464 includes a carrier core 1401, and the first and second carrier layers 1402-1404.

The first substrate 1460 includes the dielectric layers 1424, 1444 and 1450. The first substrate 1460 also includes several vias (e.g., via 1436) and several via pads (e.g., pad 1440). The second substrate 1462 includes the dielectric layers 1420, 1442 and 1446. The second substrate 1462 also includes several vias (e.g., via 1434) and several via pads (e.g., pad 1438). In some implementations, the first and/or second substrate 1460 & 1462 may be used to provide a substrate that include embedded interconnects (e.g., embedded trace) and/or surface interconnects (e.g., surface traces)

Figure 14F:
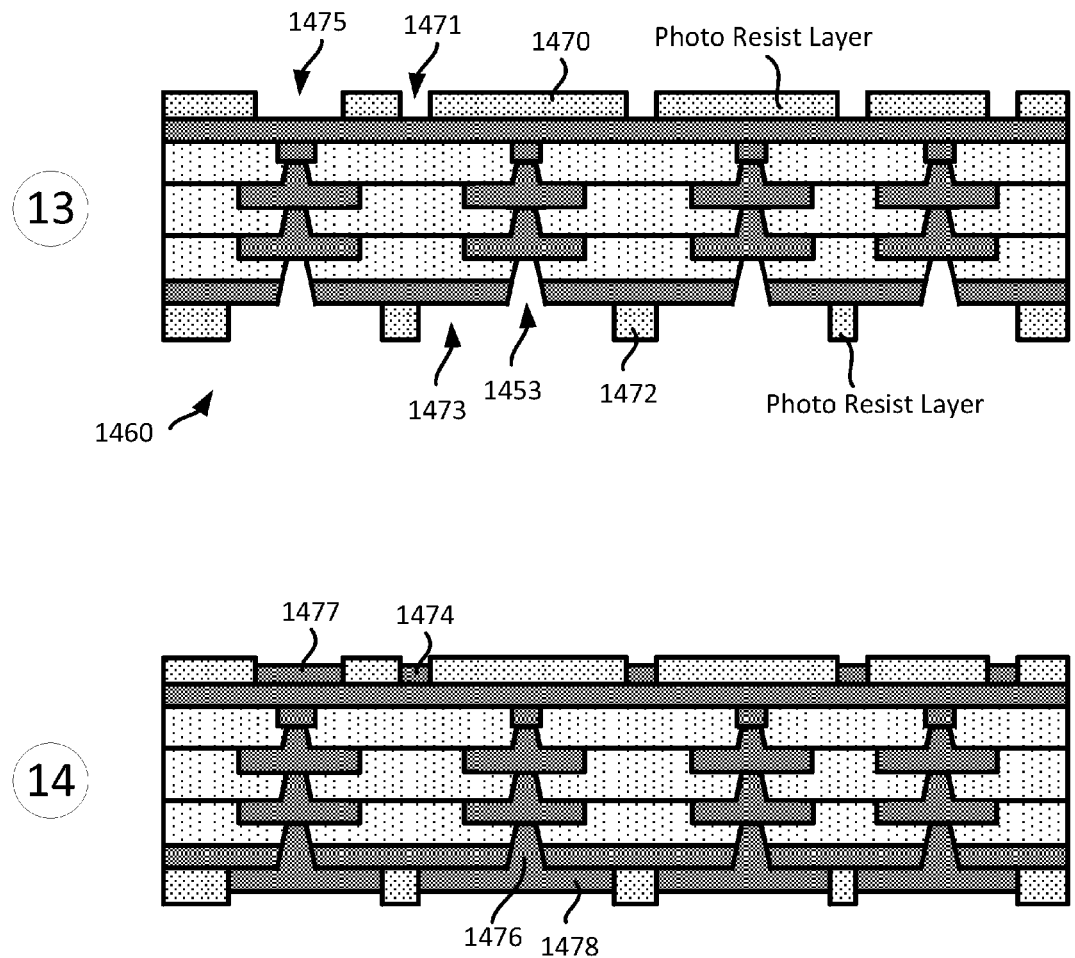

Stage 13 of FIG. 14F illustrates a substrate (e.g. first substrate 1460, second substrate 1462) after a first photo resist layer 1470 and a second photo resist layer 1472 have been applied (e.g., provided) on the substrate and selectively etched. In some implementations, etching the first and second photo resist layers 1470 & 1472 includes exposing the photo resist layers 1470 & 1472 and developing the first and second photo resist layers. However, different implementations, may selectively etch the photo resist layers 1470 & 1472. In some implementations, selectively etching the first and second photo resist layers 1470 & 1472 may create one or more cavities (e.g., cavity 1471, cavity 1473, cavity 1475) in the first and second photo resist layers 1470 & 1472.

At stage 14, a patterning process is provided on the substrate (e.g., substrate 1460). In some implementations, patterning includes providing a metal layer in the cavities (e.g., cavity 1453, cavity 1471, cavity 1473, cavity 1475), which may define one or more interconnects (e.g., traces), vias and/or via pads. In some implementations, the patterning process may include a patterning plating process. In some implementations, the metal layer may be a copper metal layer. For example, in some implementations, filling the via cavity 1471 with a metal layer (e.g., copper layer) provides an interconnect 1474, filing the cavity 1475 with a metal layer (e.g., copper layer) provides a pad 1477, and filling the cavities 1453 and 1473 with a metal layer (e.g., copper layer) provides a via 1476 and a via pad 1478.

Figure 14G:
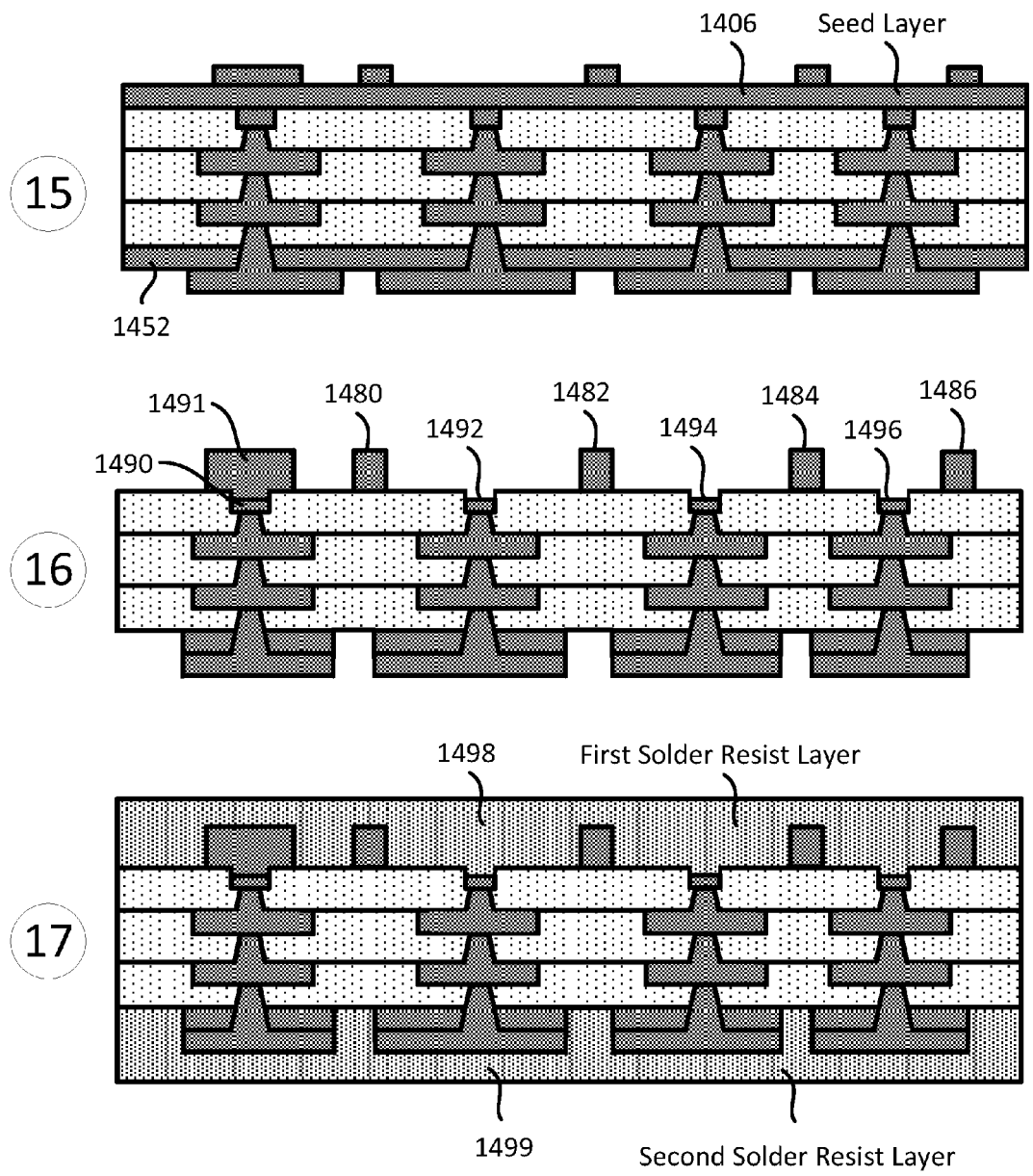

As shown in FIG. 14G, the first and second photo resist layers 1470 and 1472 are removed (at stage 15). Different implementations may remove the photo resist layers 1470 and 1472 differently.

At stage 16, a metal layer (e.g., metal layer 1452) and a seed layer (e.g., seed layer 1406) are selectively etched and/or removed. In some implementations, selectively etching the seed layer (e.g., see layer 1406) provides several surface interconnects (e.g., first surface interconnect 1480, second surface interconnect 1482, third surface interconnect 1484, and fourth surface interconnect 1486) on the substrate (e.g., substrate 1460) and several embedded interconnects (e.g., first embedded interconnect 1490, second embedded interconnect 1492, third embedded interconnect 1494, and fourth embedded interconnect 1496) in the substrate (e.g., substrate 1460). The surface interconnects are on a first surface (e.g., top surface) of the substrate. The embedded interconnects are in the first surface (e.g., top surface) of the substrate. As shown at stage 16, the embedded interconnects (e.g., interconnects 1492, 1494, 1496) are also etched to provide offset embedded interconnects. The offset embedded interconnects are offset towards an inner portion of the dielectric layer. In some implementations, an inner portion of the dielectric layer is the portion of the dielectric layer that is between a first surface (e.g., top surface) of the dielectric and a second surface (e.g., bottom surface) of the dielectric. In some implementations, an inner portion of the dielectric layer is any portion of the dielectric layer except a surface portion of the dielectric layer. For example, an inner portion of the dielectric layer may include a center portion of the dielectric layer. In some implementations, an offset embedded interconnect is an embedded interconnect offset from the surface of the dielectric (e.g., dielectric layer) such that a cavity in the dielectric is between the embedded interconnect and the surface of the dielectric.

In some implementations, selectively etching the seed layer (e.g., see layer 1406) provides a pad (e.g., pad 1491) on the substrate. As shown at stage 16, the pad 1491 is coupled to the interconnect 1490.

It should be noted that in some implementations, the embedded interconnects are not offset and are instead aligned with a surface of the dielectric layer. An example of embedded interconnects is described in FIG. 15, which is further described below. In some implementations, more than one pad may also be provided on the first surface of the substrate. These pads may be coupled to the surface interconnects and/or embedded interconnects in some implementations.

In some implementations, the lateral spacing between two neighboring surface interconnects is 30 microns (μm) or less. In some implementations, the lateral spacing between two neighboring embedded interconnects is 30 microns (μm) or less. In some implementations, a spacing (e.g., lateral spacing) defines a distance between edges of two neighboring interconnects (e.g., two neighboring traces). In some implementations, the lateral spacing between a pad and a neighboring surface interconnects is 30 microns (μm) or less. In some implementations, the lateral spacing between a neighboring embedded interconnect and a neighboring surface interconnect (e.g., first interconnect 302 and sixth interconnect 303) is 10 microns (μm) or less. In some implementations, the lateral spacing between a pad and a neighboring embedded interconnects is 10 microns (μm) or less.

In some implementations, the lateral spacing between two neighboring surface interconnects is 15 microns (μm) or less. In some implementations, the lateral spacing between two neighboring embedded interconnects is 15 microns (μm) or less. In some implementations, a spacing (e.g., lateral spacing) defines a distance between edges of two neighboring interconnects (e.g., two neighboring traces). In some implementations, the lateral spacing between a pad and a neighboring surface interconnects is 15 microns (μm) or less. In some implementations, the lateral spacing between a neighboring embedded interconnect and a neighboring surface interconnect (e.g., first interconnect 302 and sixth interconnect 303) is 5 microns (μm) or less. In some implementations, the lateral spacing between a pad and a neighboring embedded interconnects is 5 microns (μm) or less.

As shown at stage 16, the substrate may include one or more dielectric layers. Different implementations may provide different number of dielectric layers in the substrate.

As further shown in FIG. 14G, a first solder resist layer 1498 and a second solder resist layer 1499 are provided (at stage 17) on the substrate. In some implementations, the first solder resist layer 1498 is provided on a first surface (e.g., top surface) of the substrate, a second solder resist layer 1499 is provided on a second surface (e.g., bottom surface) of the substrate. The first solder resist layer 1498 may cover the entire first surface of the substrate or only a portion of the first surface of the substrate. In some implementations, the first solder resist layer 1498 may cover some portions or all of the interconnects (e.g., surface interconnects, embedded interconnects) and/or pads. Similarly, the second solder resist layer 1499 may cover the entire second surface of the substrate or only a portion of the second surface of the substrate.

In some implementations, the second solder resist layer 1499 may cover some portions or all of the interconnects (e.g., surface interconnects, embedded interconnects) and/or pads.

Figure 15:
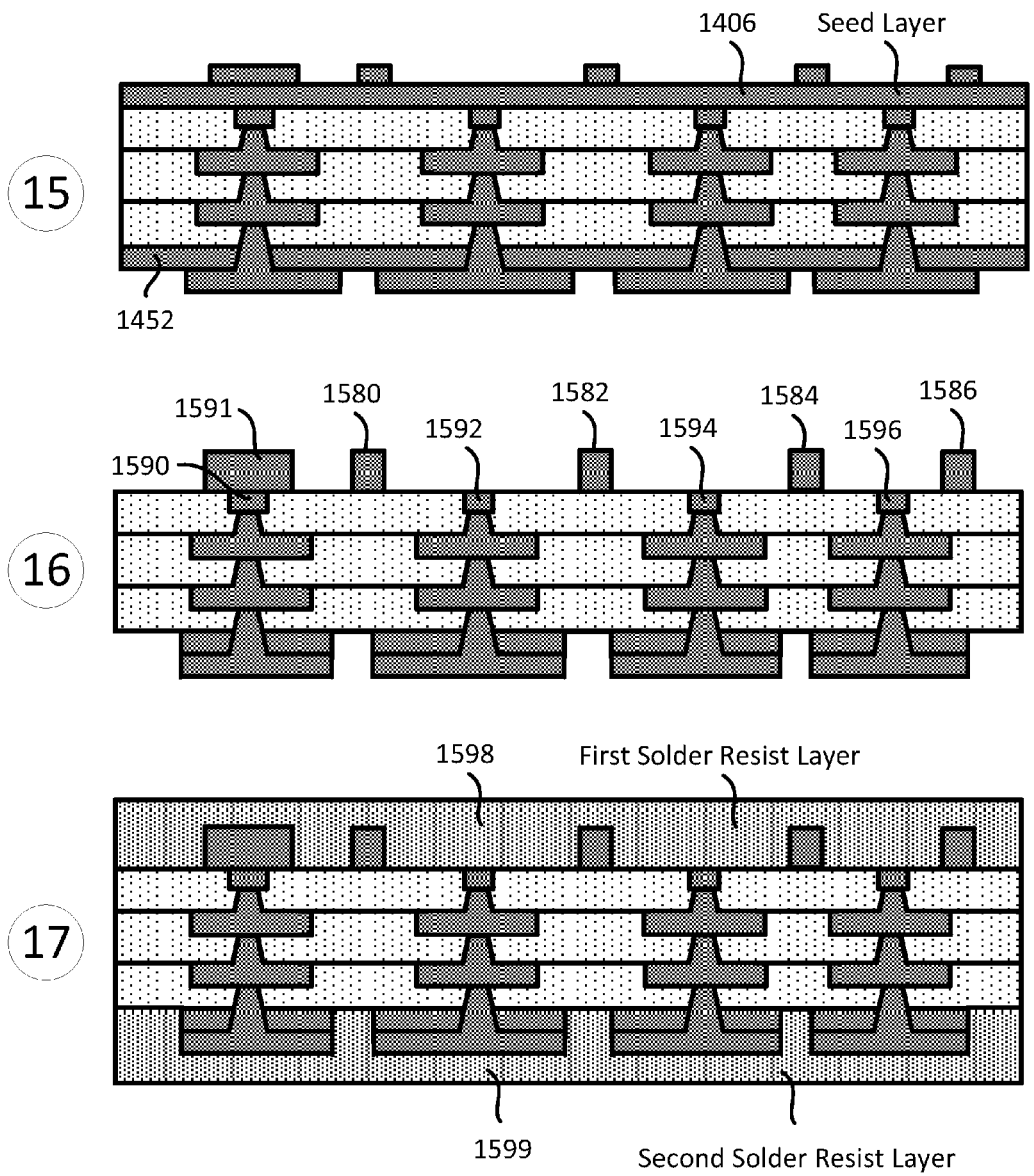
FIG. 15 illustrate an exemplary portion of a sequence for providing a substrate that includes an embedded interconnect, a surface interconnect, and/or a pad.

As mentioned at stage 16 of FIG. 14G, in some implementations, the embedded interconnects are not offset from the surface of the dielectric layer. FIG. 15 illustrates an example of stages 15-17 of a sequence for providing a substrate that includes embedded interconnects and surface interconnects. Stage 15 of FIG. 15 is similar to stage 15 of FIG. 14G. Stage 16 of FIG. 15 is similar to stage 16 of FIG. 14G, except that the substrate includes embedded interconnects that are not offset from a surface of a dielectric layer. Stage 17 of FIG. 15 is similar to stage 17 of FIG. 14G. In some implementations, stages 15-17 occurs after stage 14 of FIG. 14F.

As shown in FIG. 15, at stage 16, a metal layer (e.g., metal layer 1452) and a seed layer (e.g., seed layer 1406) are selectively etched and/or removed. In some implementations, selectively etching the seed layer (e.g., see layer 1406) provides several surface interconnects (e.g., first surface interconnect 1580, second surface interconnect 1582, third surface interconnect 1584, and fourth surface interconnect 1586) on the substrate (e.g., substrate 1560) and several embedded interconnects (e.g., first embedded interconnect 1590, second embedded interconnect 1592, third embedded interconnect 1594, and fourth embedded interconnect 1596) in the substrate (e.g., substrate 1560). The surface interconnects are on a first surface (e.g., top surface) of the substrate. The embedded interconnects are in the first surface (e.g., top surface) of the substrate.

In some implementations, selectively etching the seed layer (e.g., see layer 1406) provides a pad (e.g., pad 1591) on the substrate. As shown at stage 16, the pad 1591 is coupled to the interconnect 1590.

It should be noted that in some implementations, the substrate may include combination of offset embedded interconnects and non-offset embedded interconnects.

As further shown in FIG. 15, a first solder resist layer 1598 and a second solder resist layer 1599 are provided (at stage 17) on the substrate. In some implementations, the first solder resist layer 1598 is provided on a first surface (e.g., top surface) of the substrate, a second solder resist layer 1599 is provided on a second surface (e.g., bottom surface) of the substrate. The first solder resist layer 1598 may cover the entire first surface of the substrate or only a portion of the first surface of the substrate. In some implementations, the first solder resist layer 1598 may cover some portions or all of the interconnects (e.g., surface interconnects, embedded interconnects) and/or pads. Similarly, the second solder resist layer 1599 may cover the entire second surface of the substrate or only a portion of the second surface of the substrate. In some implementations, the second solder resist layer 1599 may cover some portions or all of the interconnects (e.g., surface interconnects, embedded interconnects) and/or pads.

It should also be noted that the above method/sequence for providing/manufacturing the substrate that includes embedded interconnects (e.g., offset embedded traces), surface interconnects (e.g., surface traces) and/or pads is easy and cost effective.

Figure 16:
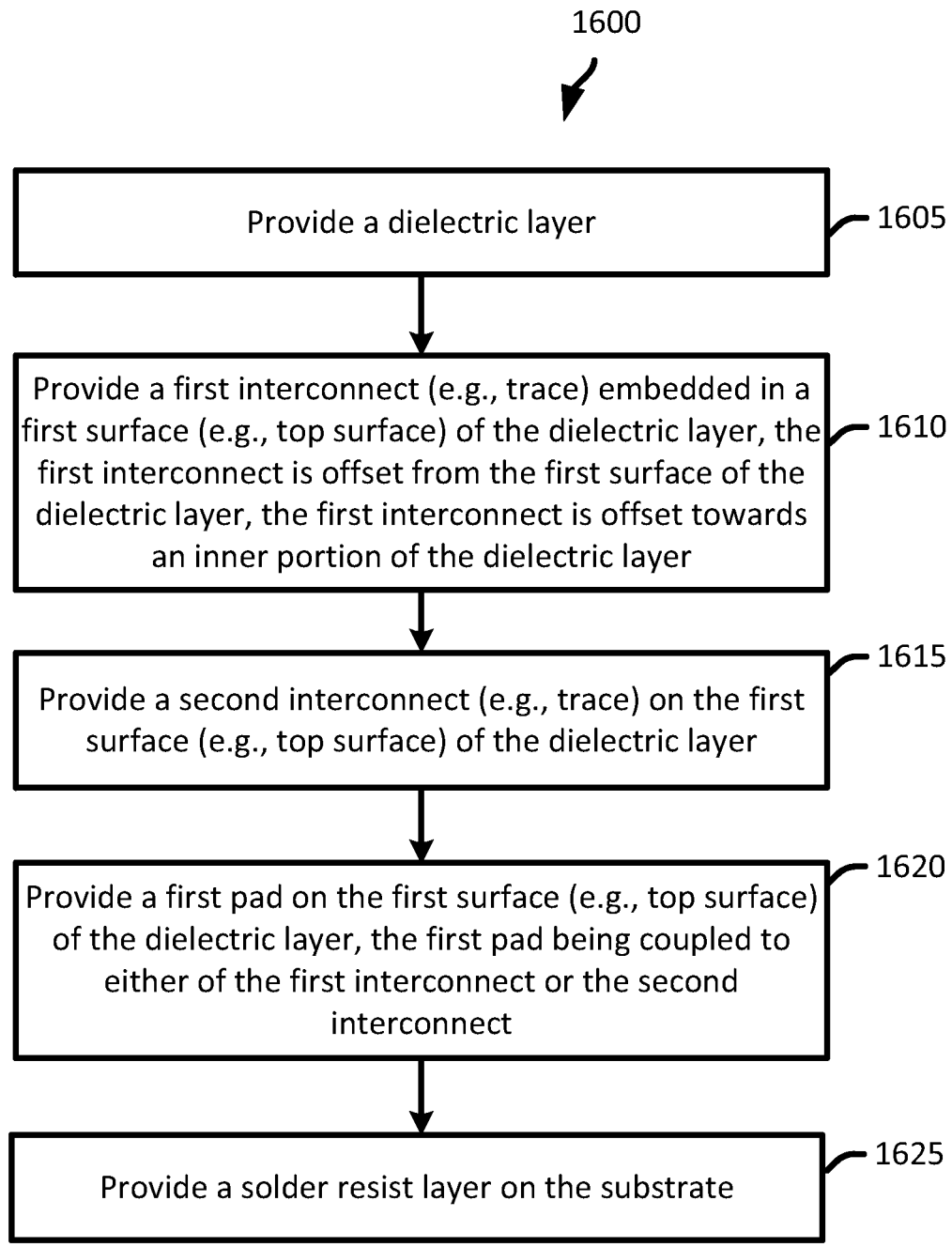
FIG. 16 illustrate an exemplary flow diagram of a method for providing a substrate that includes an embedded interconnect, a surface interconnect, and/or a pad.

Exemplary Flow Diagram of a Method for Providing/Manufacturing a Substrate that Includes Embedded Interconnects and/or Surface Interconnects FIG. 16 illustrate an exemplary flow diagram of a high level method for providing/manufacturing a substrate (e.g., package substrate) that includes embedded interconnects, surface interconnects and/or pads. It should be noted that for the purpose of clarity and simplification, the flow diagram of FIG. 16 does not necessarily include all the steps of providing/manufacturing a substrate that includes one or more embedded interconnects, surface interconnects and/or pads. Moreover, in some instances, several steps may have been combined into a single step in order to simplify the description of the sequences.

As shown in FIG. 16, the method provides (at step 1605) a dielectric layer. Different implementations may provide the dielectric layer differently. FIG. 14B illustrates an example of providing a dielectric layer. For example, stage 6 of FIG. 14B illustrates a dielectric layer (e.g., dielectric layers 1420 and 1424) being provided.

The method then provides (at step 1610) a first interconnect embedded in a first surface of the dielectric layer. In some implementations, the first surface of the dielectric layer is a top surface or bottom surface of the dielectric layer. The first interconnect is an embedded interconnect in some implementations. In some implementations, the first interconnect is an offset embedded interconnect. In some implementations, an offset embedded interconnect is an interconnect that is offset from a surface of the dielectric layer and offset towards an inner portion of the dielectric layer. In some implementations, an offset embedded interconnect is an embedded interconnect offset from the surface of the dielectric (e.g., dielectric layer) such that a cavity in the dielectric is between the offset embedded interconnect and the surface of the dielectric. In some implementations, the first interconnect is a copper trace. In some implementations, providing the first interconnect embedded in the first surface includes providing several first interconnects embedded in the first surface of the dielectric. In some implementations, the lateral spacing between two neighboring embedded interconnects is 30 microns (μm) or less. In some implementations, the lateral spacing between two neighboring embedded interconnects is 15 microns (μm) or less. Stages 4-6 of FIG. 14B illustrate an example of providing embedded interconnects in a dielectric layer.

The method also provides (at step 1615) a second interconnect on the first surface of the dielectric layer. In some implementations, the first surface of the dielectric layer is a top surface or bottom surface of the dielectric layer. The second interconnect is a surface interconnect in some implementations. In some implementations, the second interconnect is a copper trace. In some implementations, providing the second interconnect on the first surface includes providing several second interconnects on the first surface of the dielectric. In some implementations, the lateral spacing between two neighboring surface interconnects is 30 microns (μm) or less. In some implementations, the lateral spacing between two neighboring surface interconnects is 15 microns (μm) or less. Stages 14-15 of FIGS. 14F-14G illustrate an example of providing surface interconnects in a dielectric layer. In some implementations, the lateral spacing between a neighboring embedded interconnect and a neighboring surface interconnect (e.g., first interconnect and second interconnect) is 10 microns (μm) or less. In some implementations, the lateral spacing between a neighboring embedded interconnect and a neighboring surface interconnect (e.g., first interconnect and second interconnect) is 5 microns (μm) or less.

The method further provides (at step 1620) a first pad on the first surface of the dielectric layer. The first pad is coupled to either of the first interconnect or the second interconnect. In some implementations, providing the first pad includes providing several pads on the first surface of the dielectric layer. In some implementations, each pad is coupled to an embedded interconnect or a surface interconnect.

The method also provides (at step 1625) a solder resist layer on the substrate. In some implementations, providing the solder resist layer includes providing a solder resist layer on the first surface of the dielectric layer. In some implementations, when the solder resist layer is provided (at 1625), the solder resist layer may cover some or all of the first surface of the dielectric layer. In some implementations, the solder resist layer may cover some portions or all of the interconnects (e.g., surface interconnects, embedded interconnects) and/or pads. In some implementations, providing a solder resist layer includes provides a first solder resist layer and a second solder resist layer. The first solder resist layer is on a first surface of the substrate. The second solder resist layer is on a second surface of the substrate.

Exemplary Electronic Devices

Figure 17:
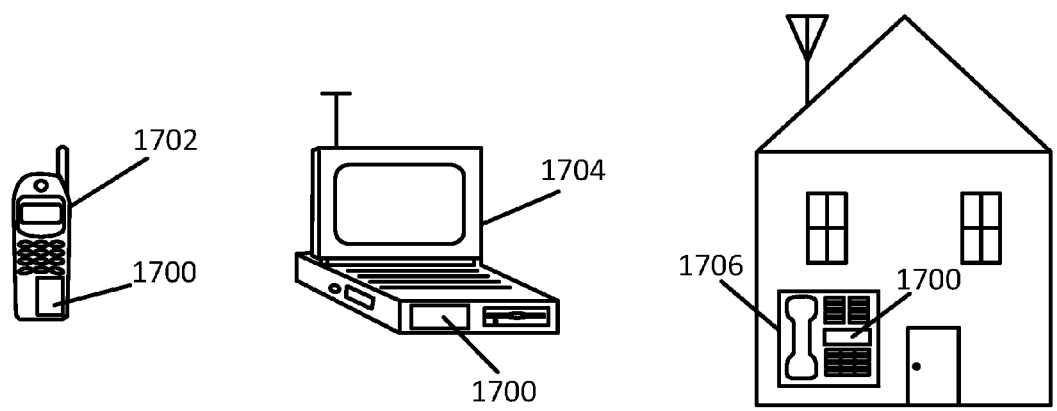
FIG. 17 illustrates various electronic devices that may integrate a substrate, an integrated circuit and/or PCB described herein.

FIG. 17 illustrates various electronic devices that may be integrated with any of the aforementioned substrate, semiconductor device, integrated circuit, die, interposer or package. For example, a mobile telephone 1702, a laptop computer 1704, and a fixed location terminal 1706 may include an integrated circuit (IC) 1700 as described herein. The IC 1700 may be, for example, any of the integrated circuits, dice or packages described herein. The devices 1702, 1704, 1706 illustrated in FIG. 17 are merely exemplary. Other electronic devices may also feature the IC 1700 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 3, 4, 5, 6, 7, 8, 9 10A-10B, 11A-11B, 12A-12B, 13A-13B, 14A-14G, 15, 16 and/or 17 may be rearranged and/or combined into a single component, step, feature or function or embodied in several components, steps, or functions. Additional elements, components, steps, and/or functions may also be added without departing from the invention.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

In some implementations, the term "surface of a substrate" shall mean the surface of the substrate before cavities are created in the substrate. In some implementations, the term "surface of a dielectric" shall mean the surface of the dielectric before cavities are created in the dielectric.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A substrate comprising:
   a first dielectric layer comprising a first surface and a second surface;
   a first interconnect embedded in the first dielectric layer, the first interconnect comprising a first side and a second side, the first side is surrounded by the first dielectric layer, wherein at least a part of the second side is free of contact with the first dielectric layer;
   a first cavity traversing the first surface of the first dielectric layer to the second side of the first interconnect, wherein the first cavity overlaps the first interconnect; and
   a second interconnect on the first surface of the first dielectric layer, the second interconnect comprising a third side and a fourth side, the second interconnect is non-overlapping with the first interconnect, wherein the third side is coupled to the first surface of the first dielectric layer.

2. The substrate of claim 1, further comprising:
   a third interconnect embedded in the first dielectric layer, the third interconnect comprising a fifth side and a sixth side, the fifth side is surrounded by the first dielectric layer, wherein at least a part of the sixth side is free of contact with the first dielectric layer;
   a second cavity traversing the first surface of the first dielectric layer to the sixth side of the third interconnect, wherein the second cavity overlaps the third interconnect; and
   a fourth interconnect on the first surface of the first dielectric layer, the fourth interconnect comprising a seventh side and an eighth side, the fourth interconnect is non-overlapping with the third interconnect, wherein the seventh side is coupled to the first surface of the first dielectric layer.

3. The substrate of claim 2, wherein a lateral spacing between the first interconnect and the third interconnect is 30 microns (µm) or less.

4. The substrate of claim 1, wherein a lateral spacing between the first interconnect and the second interconnect is 10 microns (µm) or less, wherein the first interconnect and the second interconnect are adjacent interconnects.

5. The substrate of claim 1, further comprising:
   a first pad on the first surface of the first dielectric layer, the first pad coupled to the first interconnect; and
   a second pad on the first surface of the first dielectric layer, the second pad coupled to the second interconnect.

6. The substrate of claim 1, further comprising a second dielectric layer.

7. The substrate of claim 1, wherein the first and second interconnects are traces.

8. The substrate of claim 1, wherein the substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

9. The substrate of claim 1, wherein at least a part of the fourth side is free of contact with the first dielectric layer.

10. The substrate of claim 1, wherein the first side is located at a first distance from the first surface of the dielectric layer, the second side is located at a second distance from the first surface of the dielectric layer, the first distance is greater than the second distance.

11. The substrate of claim 1, wherein the first cavity is one of at least an empty cavity or a cavity that is at least partially filled with a non-conducting material.

12. The substrate of claim 11, wherein the non-conducting material is a solder resist layer.

13. The substrate of claim 1, wherein the first cavity overlaps the first interconnect along a first direction that is perpendicular to the first surface of the first dielectric layer.

14. The substrate of claim 1, wherein the second interconnect is non-overlapping with the first interconnect along a first direction that is perpendicular to the first surface of the first dielectric layer.

15. A method for fabricating a substrate, comprising:
forming a first dielectric layer comprising a first surface and a second surface;
forming a first interconnect inside the first dielectric layer, wherein forming the first interconnect comprises:
forming a first side of the first interconnect in the first dielectric layer such that the first side is surrounded by the first dielectric layer;
forming a second side of the first interconnect in the first dielectric layer such that at least a part of the second side is free of contact with the first dielectric layer, wherein the second side is formed in the first dielectric layer offset from the first surface of the first dielectric layer such that a first cavity in the first dielectric layer is formed between the first surface of the first dielectric layer and the second side of the first interconnect; and
forming a second interconnect on the first surface of the first dielectric layer, such that the second interconnect is non-overlapping with the first interconnect, wherein forming the second interconnect comprises:
forming a third side of the second interconnect on the first surface of the first dielectric layer; and
forming a fourth side of the second interconnect outside of the first dielectric layer.

16. The method of claim 15, further comprising:
forming a third interconnect inside the first dielectric layer, wherein forming the third interconnect comprises:
forming a fifth side of the third interconnect in the first dielectric layer such that the fifth side is surrounded by the first dielectric layer; and
forming a sixth side of the third interconnect in the first dielectric layer such that at least a part of the sixth side is free of contact with the first dielectric layer, wherein the sixth side is formed in the first dielectric layer offset from the first surface of the first dielectric layer such that a second cavity in the first dielectric layer is formed between the first surface of the first dielectric layer and the sixth side of the third interconnect and
forming a fourth interconnect on the first surface of the first dielectric layer, such that the fourth interconnect is non-overlapping with the third interconnect, wherein forming the fourth interconnect comprises:
forming a seventh side of the fourth interconnect on the first surface of the first dielectric layer; and
forming an eighth side of the fourth interconnect outside of the first dielectric layer.

17. The method of claim 16, wherein a lateral spacing between the first interconnect and the third interconnect is 30 microns (μm) or less.

18. The method of claim 15, wherein a lateral spacing between the first interconnect and the second interconnect is 10 microns (μm) or less, wherein the first interconnect and the second interconnect are adjacent interconnects.

19. The method of claim 15, further comprising:
forming a first pad on the first surface of the first dielectric layer, such that the first pad is coupled to the first interconnect; and
forming a second pad on the first surface of the first dielectric layer, such that the second pad is coupled to the second interconnect.

20. The method of claim 15, wherein the substrate is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

21. The method of claim 15, wherein at least a part of the fourth side is free of contact with the first dielectric layer.

22. The method of claim 15, wherein forming the first cavity comprises removing a portion of the first interconnect to form the first cavity in the first dielectric layer.

23. The method of claim 15, further comprising at least partially filling the first cavity with a non-conducting material.

24. The method of claim 23, wherein the non-conducting layer is a solder resist layer.

* * * * *